(12) United States Patent
Shiraishi et al.

(10) Patent No.: US 9,184,840 B2
(45) Date of Patent: Nov. 10, 2015

(54) OPTICAL MODULE

(71) Applicant: FUJITSU LIMITED, Kawasaki-shi, Kanagawa (JP)

(72) Inventors: Takashi Shiraishi, Isehara (JP); Takatoshi Yagisawa, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 319 days.

(21) Appl. No.: 13/968,704

(22) Filed: Aug. 16, 2013

(65) Prior Publication Data

US 2014/0099121 A1    Apr. 10, 2014

(30) Foreign Application Priority Data

Oct. 5, 2012    (JP) .................... 2012-223593

(51) Int. Cl.
  *H04B 10/2507*    (2013.01)
  *H04B 10/40*    (2013.01)
  *G02B 6/43*    (2006.01)

(52) U.S. Cl.
  CPC .............. *H04B 10/2507* (2013.01); *G02B 6/43* (2013.01); *H04B 10/40* (2013.01)

(58) Field of Classification Search
  None
  See application file for complete search history.

(56) References Cited

U.S. PATENT DOCUMENTS

| | | | | |
|---|---|---|---|---|
| 6,684,007 B2 * | 1/2004 | Yoshimura et al. | ...... | G02B 6/10 257/E23.01 |
| 7,386,200 B2 * | 6/2008 | Uchida | .................... | G02B 6/43 385/14 |
| 7,474,815 B2 | 1/2009 | Budd et al. | | |
| 7,623,743 B2 * | 11/2009 | Furuyama | ............ | G02B 6/4221 385/14 |
| 7,778,502 B2 * | 8/2010 | Hiruta | ...................... | G02B 6/42 385/14 |
| 8,014,638 B2 * | 9/2011 | Nakano et al. | ........... | G02B 6/43 385/130 |
| 9,110,234 B2 * | 8/2015 | Terada et al. | .......... | G02B 6/122 1/1 |
| 2007/0223935 A1 | 9/2007 | Asai et al. | | |

FOREIGN PATENT DOCUMENTS

| | | |
|---|---|---|
| JP | 2005-331702 | 12/2005 |
| JP | 2006-120956 | 5/2006 |
| JP | 2012-32509 | 2/2012 |

* cited by examiner

*Primary Examiner* — Michelle R Connelly
*Assistant Examiner* — John M Bedtelyon
(74) *Attorney, Agent, or Firm* — Staas & Halsey LLP

(57) ABSTRACT

An optical module includes first optical elements disposed on a first surface side of optical waveguides, first signal wirings disposed on the first surface side in parallel with each other in a direction intersecting with a transmission direction of an electrical signal transmitted by a first signal wiring, second optical elements disposed on a second surface side of the optical waveguides, and second signal wirings disposed on the second surface side in parallel with each other in a direction intersecting with a transmission direction of an electrical signal transmitted by a second signal wirings, the optical waveguides being disposed in parallel with each other in a direction intersecting with an optical waveguide direction of an optical signal guided by an optical waveguide at an interval which is narrower than an interval between the adjacent first signal wirings and narrower than an interval between the adjacent second signal wirings.

10 Claims, 25 Drawing Sheets

OPTICAL MODULE

CROSS-REFERENCE TO RELATED APPLICATION

This application is based upon and claims the benefit of priority from the prior Japanese Patent Application No. 2012-223593 filed on Oct. 5, 2012, the entire contents of which are incorporated herein by reference.

FIELD

The embodiments discussed herein are related to an optical module.

BACKGROUND

An optical module known in the related art optically couples a planar optical device configured to emit or receive light in a direction substantially perpendicular to a substrate and an optical waveguide configured to guide light in a direction parallel to the substrate. A technology included in such an optical module disposes optical devices two-dimensionally by shifting the positions of the optical devices so as to reduce the pitch of the optical devices to be narrower than that of optical waveguides. See, e.g., U.S. Pat. No. 7,474,815.

Also, a technology known in the art mounts optical elements on the opposite sides of an optical waveguide to sandwich the optical waveguide therebetween in which the light coupled to the optical element disposed on the first side of the optical waveguide and the light coupled to the optical element disposed on the second side of the optical waveguide are propagated in opposite directions within the optical waveguide. See, e.g., Japanese Patent Laid-open Publication No. 2006-120956.

In addition, a technology known in the art optically couples an optical fiber and an optical element by forming a recess inclined at 45 degrees on the core of the optical fiber, installing a mirror in the recess, and disposing the optical element directly above the mirror. See, e.g., Japanese Patent Laid-open Publication 2005-331702.

Furthermore, a technology known in the art optically couples an optical element and an optical fiber by disposing optical elements on the sides of the optical fiber to sandwich the optical fiber therebetween in which light is totally reflected by a total reflection plane. See, e.g., Japanese Patent Laid-open Publication No. 2012-032509.

SUMMARY

According to an aspect of the embodiment, an optical module includes first optical elements disposed on a first surface side of optical waveguides, first signal wirings disposed on the first surface side in parallel with each other in a direction intersecting with a transmission direction of an electrical signal transmitted by a first signal wiring, second optical elements disposed on a second surface side of the optical waveguides, and second signal wirings disposed on the second surface side in parallel with each other in a direction intersecting with a transmission direction of an electrical signal transmitted by a second signal wirings, the optical waveguides being disposed in parallel with each other in a direction intersecting with an optical waveguide direction of an optical signal guided by an optical waveguide at an interval which is narrower than an interval between the adjacent first signal wirings and narrower than an interval between the adjacent second signal wirings.

The objects and advantages of the invention will be realized and attained by means of the elements and combinations particularly pointed out in the claims.

It is to be understood that both the foregoing general description and the following detailed description are exemplary and explanatory and are not restirctive of the invention, as claimed.

DESCRIPTION OF EMBODIMENTS

When optical elements are disposed two-dimensionally by shifting the positions thereof, the density of electric signal wirings connected to the optical elements increases and an interval between adjacent electric signal lines is narrowed. Thus, there is a problem in that electric characteristics deteriorate. As a result, a crosstalk may occur between the adjacent signal lines and noise may be generated due to the crosstalk.

Hereinafter, exemplary embodiments of optical modules will be described in detail with reference to accompanying drawings. In the following descriptions of each exemplary embodiment, the same constitutional components will be designated by the same symbols and a redundant description will be omitted.

First Exemplary Embodiment of Optical Module

Figure 1:
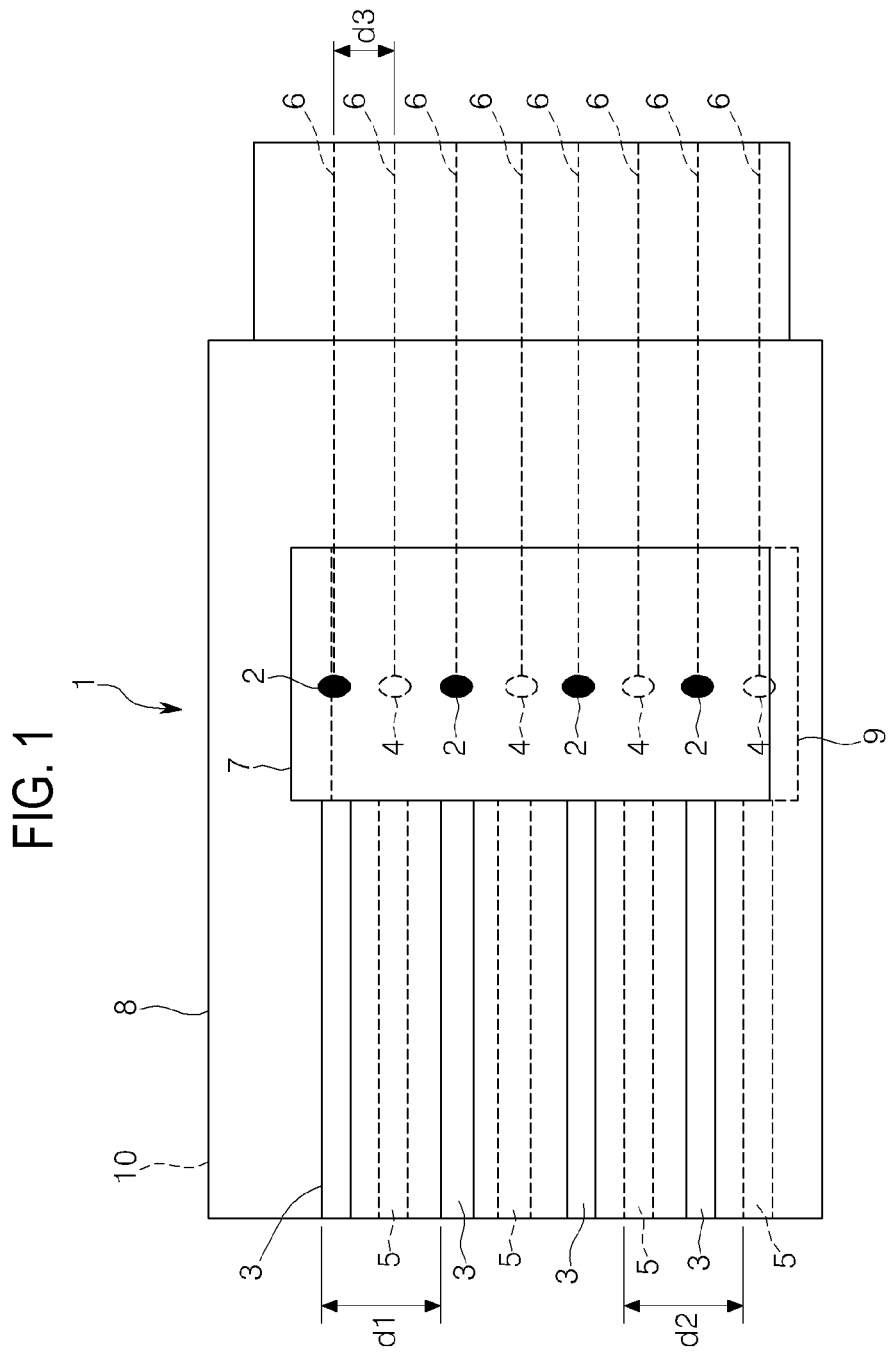
FIG. 1 is a top plan view illustrating an optical module according to a first exemplary embodiment.

FIG. 1 is a top plan view illustrating an optical module according to a first exemplary embodiment. As illustrated in FIG. 1, the optical module 1 includes a plurality of first optical elements 2, a plurality of first electric signal wirings 3, a plurality of second optical elements 4, a plurality of second electric signal wirings 5, and a plurality of optical waveguides 6.

The first optical elements 2 conduct a conversion between an electric signal and an optical signal. The first optical elements 2 are disposed on a first surface side of the optical waveguides 6. In FIG. 1, the front surface side of the drawing is referred to as the first surface side of the optical waveguides 6. Examples of the first optical elements 2 include a light emitting device such as, for example, a VCSEL (Vertical Cavity Surface Emitting LASER) or a light receiving device such as, for example, a PD (Photo Diode). The first optical elements 2 may be provided on, for example, a first semiconductor substrate 7 disposed on the first surface side of the optical waveguides 6.

The first electric signal wirings 3 transmit an electric signal input to the first optical elements 2 when the first optical elements 2 are light emitting devices, or transmit an electric signal output from the first optical elements 2 when the first optical elements 2 are light receiving devices. The first electric signal wirings 3 are disposed on the first surface side of the optical waveguides 6 side by side in parallel with each other in a direction intersecting with the transmission direction of the electric signal transmitted by the first electric signal wirings 3. In FIG. 1, the electric signal is transmitted in the left and right direction of the drawing.

Accordingly, in FIG. 1, the up and down direction of the drawing is the direction intersecting with the transmission direction of the electric signal transmitted by the first electric signal wirings 3. That is, the first electric signal wirings 3 form the rows in the up and down direction of the drawing. The first electric signal wirings 3 may be provided on, for example, a first electric circuit board 8 disposed on the first surface side of the optical waveguides 6. The first semiconductor substrate 7 may be disposed on the first electric circuit board 8.

The second optical elements 4 conduct a conversion between an electric signal and an optical signal. The second optical elements 4 are disposed on a second surface side of the optical waveguides 6. In FIG. 1, the rear surface side of the drawing is referred to as the second surface side of optical waveguides 6. Examples of the second optical elements 4 include a light emitting device such as, for example, a VCSEL or a light receiving device such as, for example, a PD. The second optical elements 4 may be provided on, for example, a second semiconductor substrate 9 disposed on the second surface side of the optical waveguides 6. The first optical elements 2 and the second optical elements 4 may be alternately disposed.

The second electric signal wirings 5 transmit an electric signal input to the second optical elements 4 when the second optical elements 4 are light emitting devices, or transmits an electric signal output from the second optical elements 4 when the second optical elements 4 are light receiving devices. The second electric signal wirings 5 are disposed on the second surface side of the optical waveguides 6 side by side in parallel with each other in a direction intersecting with the transmission direction of the electric signal transmitted by the second electric signal wiring 5. In FIG. 1, the electric signal is transmitted in the left and right direction of the drawing.

Accordingly, the up and down direction in FIG. 1 is the direction intersecting with the transmission direction of the electric signal transmitted by the second electric signal wirings 5. That is, the second electric signal wirings 5 form the rows in the up and down direction of the drawing. The second electric signal wirings 5 may be provided on, for example, a second electric circuit board 10 disposed on the second surface side of the optical waveguides 6. The second semiconductor substrate 9 may be disposed on the electric circuit board 10. In FIG. 1, the second electric circuit board 10 is positioned on the rear surface of the first electric circuit board 8 and, for example, disposed to overlap with the first electric circuit board 8. Thus, the second electric circuit 10 does not appear in FIG. 1. The first electric signal wirings 3 and the second electric signal wirings 5 may be alternately disposed.

The optical waveguides 6 guide an optical signal emitted from the first optical elements 2 or the second optical elements 4 when these optical elements are light emitting devices, or guide an optical signal incident on the first optical elements 2 or the second optical elements 4 when these optical elements are light receiving devices. The optical waveguides 6 are disposed side by side in parallel with each other in a direction intersecting with the wave guide direction of the optical signal wave-guided by the optical waveguide 6. In FIG. 1, the optical signal is wave-guided in the left and right direction of the drawing.

Accordingly, in FIG. 1, the up and down direction of the drawing is the direction interesting with the wave guide direction of the optical signal wave-guided by the optical waveguides 6. That is, the optical waveguides 6 form the rows in the up and down direction of the drawing. The interval d3 between adjacent optical waveguides 6 is narrower than the interval d1 between adjacent first electric signal wirings 3 and the interval d2 between adjacent second electric signal wirings 5. In other words, the first electric signal wirings 3 may be disposed at an interval wider than that of the optical waveguides 6. In addition, the second electric signal wirings 5 may be disposed at an interval wider than that of the optical waveguides 6.

For example, when the first electric signal wirings 3 and the second electric signal wirings 5 are alternately disposed, the interval d3 between adjacent optical waveguides 6 becomes one half of the interval d1 between adjacent first electric signal wirings 3 and the interval d2 between adjacent second electric signal wirings 5. Accordingly, the first electric signal wirings 3 and the second electric signal wirings 5 may be disposed at an interval which is twice wider than that of the optical waveguides 6.

According to the optical module 1 illustrated in FIG. 1, the optical waveguides 6 may be densified while maintaining the interval d1 of the first electric signal wirings 3 at an interval where a crosstalk is hardly generated between the adjacent first electric signal wirings. The optical waveguides 6 may be densified while maintaining the interval d2 of the second electric signal wirings 5 at an interval where a crosstalk is hardly generated between adjacent second electric signal wirings 5. That is, even if the optical waveguides 6 are densified, a crosstalk between adjacent first electric signal wirings 3 and a crosstalk between adjacent second electric signal wirings 5 may be suppressed. Thus, an optical module having an improved electric characteristic may be obtained.

Second Exemplary Embodiment of Otical Module

Figure 2:
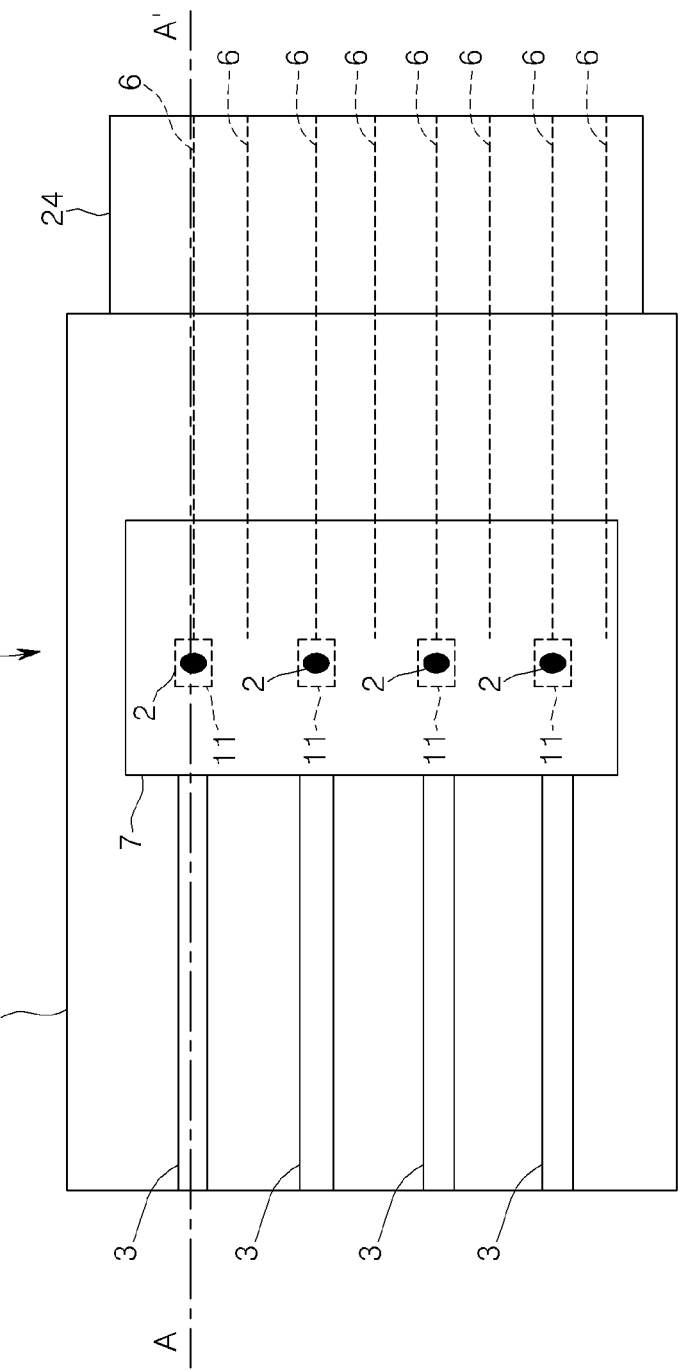
FIG. 2 is a top plan view illustrating an optical module according to a second exemplary embodiment.
Figure 3:
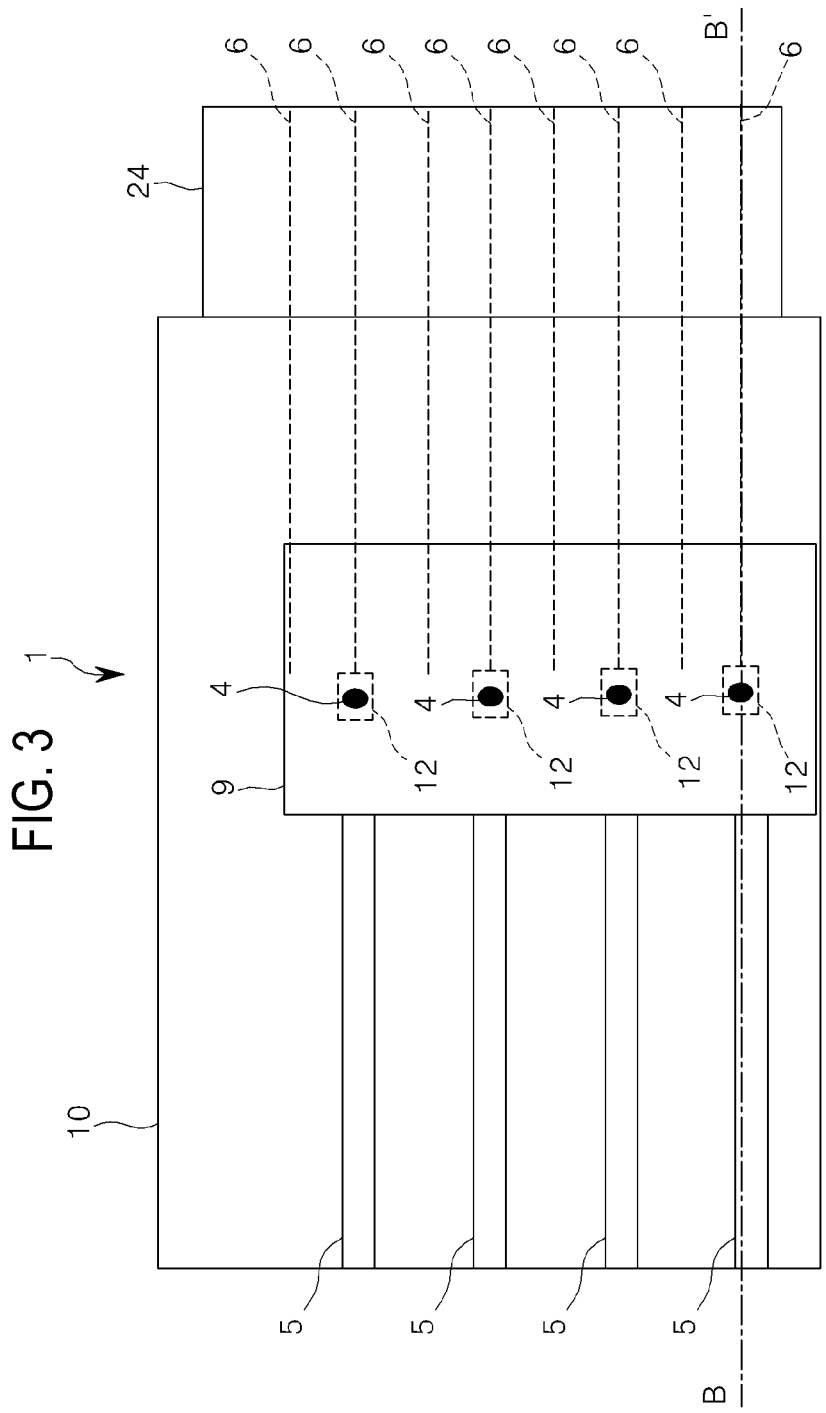
FIG. 3 is a bottom view illustrating the optical module according to the second exemplary embodiment.
Figure 4:
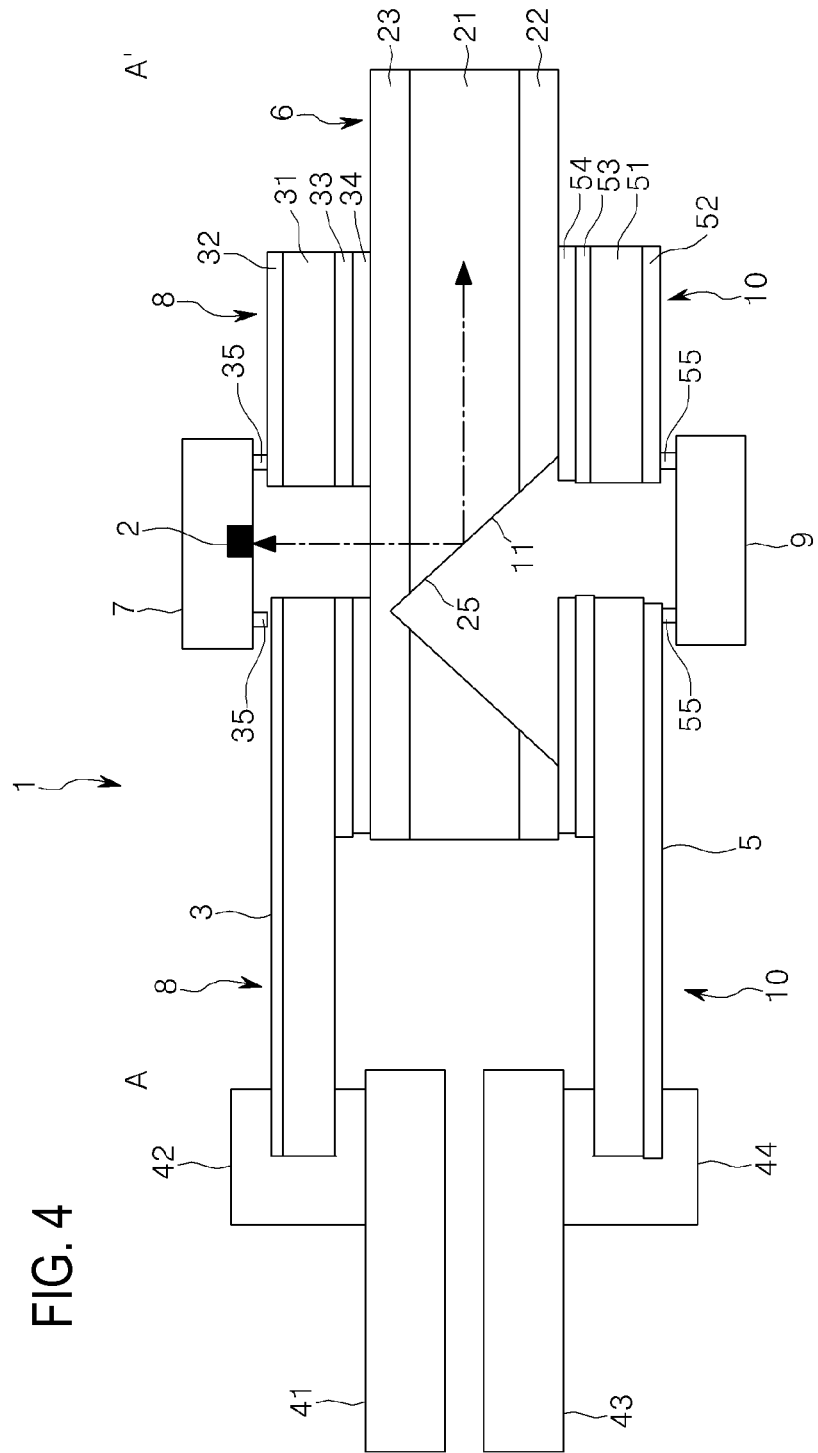
FIG. 4 is a cross-sectional view taken along the cut-line A-A' in FIG. 2.
Figure 5:
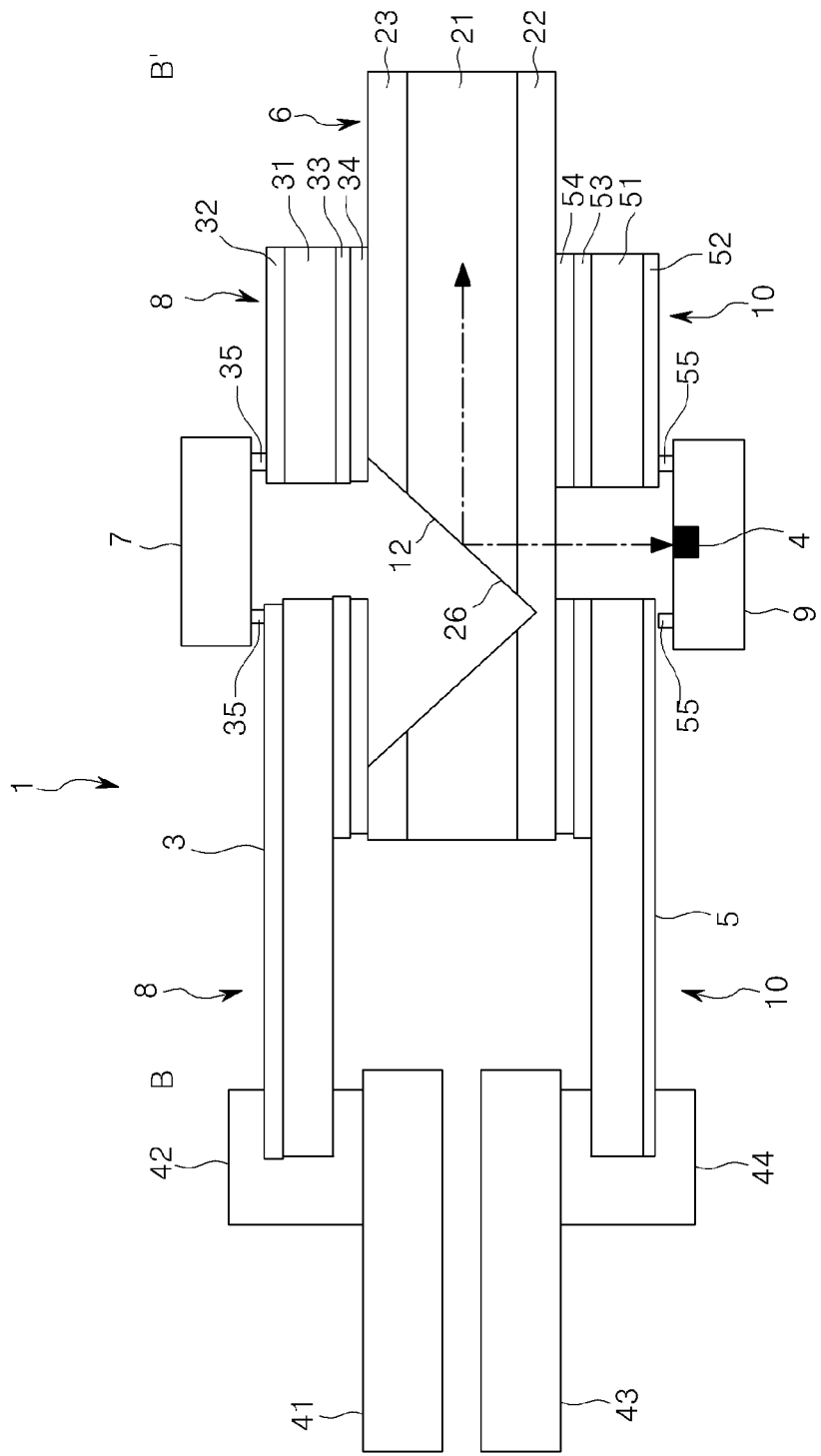
FIG. 5 is a cross-sectional view taken along the cut-line B-B' in FIG. 3.

FIG. 2 is a top plan view illustrating an optical module according to a second exemplary embodiment. FIG. 3 is a bottom view of the optical module according to the second exemplary embodiment. FIG. 4 is a cross-sectional view taken along the cut-line A-A' of FIG. 2. The cut-line A-A' passes through the first electric signal wirings 3 and the first optical elements 2. FIG. 5 is a cross-sectional view taken along the cut-line B-B' of FIG. 3. The cut-line B-B' passes through the second electric signal wirings 5 and the second optical elements 4.

As illustrated in FIGS. 2 to 5, the optical module 1 includes a plurality of first optical elements 2, a plurality of first electric signal wirings 3, a plurality of second optical elements 4, a plurality of second electric signal wirings 5, and a plurality of optical waveguides 6. The optical module 1 also includes a first semiconductor substrate 7, a first electric circuit board 8, a second semiconductor substrate 9, and a second electric circuit board 10. The optical module 1 further includes a first mirror 11 and a second mirror 12.

The up and down direction of the drawings in FIGS. 2 and 3 corresponds to the direction intersecting with the transmission direction of an electric signal transmitted by the first electric signal wirings 3 and the direction intersecting with the transmission direction of an electric signal transmitted by the second electric signal wirings 5. In addition, the up and down direction in FIGS. 2 and 3 also correspond to the direction intersecting with the wave guide direction of an optical signal wave-guided by the optical waveguides 6. Accordingly, the first electric signal wiring 3, the second electric signal wirings 5 and the optical waveguides 6 form the rows in the up and down direction of the drawings in FIGS. 2 and 3.

As illustrated in FIGS. 2 and 3, the first optical elements 2 and the second optical elements 4 may be alternately disposed. In addition, the first electric signal wirings 3 and the second electric signal wirings 5 may be alternately disposed. The interval between adjacent optical waveguides 6 is narrower than the interval between adjacent first electric signal wirings 3 and the interval between adjacent second electric signal wirings 5.

As illustrated in FIG. 4, an optical waveguide 6 includes a core 21 and clads 22, 23. An optical signal progresses within the core 21 while repeating a total reflection on the interfaces between the core 21 and the clads 22, 23. The optical waveguides 6 depicted by the broken lines in FIGS. 2 and 3 may actually be the cores 21 of the optical waveguides 6. That is, the optical module 1 includes a plurality of cores 21 covered by the clads 22, 23 on the same plane.

The number of the cores 21 equals to, for example, the number of the first optical elements 2 plus the number of the second optical elements 4. In the present exemplary embodiment, the cores 21 may be referred to as the optical waveguides 6, except for the case that it is necessary to specify the cores 21 and the clads 22, 23.

An optical waveguide array 24 with the plurality of cores 21 may be a polymer wave guide array. When the polymer wave guide array is used, the optical waveguide array 24, the first electric circuit board 8, and the second electric circuit board 10 may be integrated with each other by, for example, a laminating processing. Since the optical waveguides 6 are the same with those described with reference to FIG. 1, the redundant description thereof will be omitted.

The first electric circuit board 8 includes, for example, a polyimide layer 31, a wiring layer 32 on the outside surface of the polyimide layer 31, and a wiring layer 33 on the inside surface of the polyimide layer 31. In the first electric circuit board 8, the portions corresponding to the first optical elements 2 are formed with through-holes or transparent windows, respectively, so that optical signals may pass therethrough.

The first electric signal wirings 3 are formed in the wiring layer 32 of the outside surface of the polyimide layer 31. The first electric circuit board 8 is adhered to the first surface of the optical waveguides 6 through a bonding sheet 34. The first electric circuit board 8 may be mounted to an electric connector 42 of a board 41 such as, for example, other electric circuit board. The first electric signal wirings 3 are electrically connected to a terminal (not illustrated) in the electric connector 42.

The first electric circuit board 8 may be, for example, a flexible printed circuit board having flexibility. When the flexible printed circuit board is used, the degree of freedom of attachment of the first electric circuit board 8 increases so that the first electric circuit board 8 may be mounted to the electric connector 42 regardless of the arrangement of the board 41 and the electric connector 42 where the first electric circuit board 8 is mounted. Since the first electric signal wirings 3 are the same as those described with reference to FIG. 1, the redundant description thereof will be omitted.

The first semiconductor substrate 7 is attached to the first electric signal wirings 3 and the wiring layer 32 on the outside surface of the first electric circuit board 8 via, for example, bumps 35. When the first optical elements 2 are light emitting devices, the first semiconductor substrate 7 is attached such that the light emitting portions of the first optical elements 2 face the optical waveguides 6. When the first optical elements 2 are light receiving devices, the first semiconductor substrate 7 is attached such that the light receiving portions of the first optical elements 2 face the optical waveguides 6.

The number of the first electric signal wirings 3 equals to, for example, the number of the first optical elements 2. Each of the first electric signal wirings 3 is electrically connected to a corresponding first optical element 2 through the bumps 35. Since the first optical elements 2 are the same as those described with reference to FIG. 1, the redundant description thereof will be omitted.

Each optical waveguide 6 is formed with, for example, a V-shaped recess 25 on the second surface side of the optical waveguide 6 at a position corresponding to a first optical element 2. In the V-shaped recess 25, the inclined surface where the core 21 is exposed is in contact with air and forms a first mirror 11 that reflects an optical signal. The first mirror 11 optically couples the first optical element 2 and the optical waveguide 6.

When the first optical element 2 is a light emitting device, an optical signal emitted from the light emitting portion of the first optical element arrives at the core 21 across the clad 23 of the optical waveguide 6 and is reflected by the first mirror 11 to progress within the core 21. In FIG. 4, the arrow extending rightward from the first mirror 11 within the core 21 indicates the progressing direction of the optical signal when the first optical element 2 is a light emitting device.

When the first optical element 2 is a light receiving device, the optical signal progressing within the core 21 of the optical waveguide 6 is reflected by the first mirror 11 and arrives at the light receiving portion of the first optical element 2 across the clad 23 of the optical waveguide 6. In FIG. 4, the arrow extending from the first mirror 11 toward the first optical element 2 indicates the progressing direction of the optical signal when the first optical element 2 is a light receiving device. Accordingly, the progressing direction of the optical signal may be turned, for example, 90° by the first mirror 11. Thus, the first optical element 2 and the optical waveguide 6 may be optically coupled with each other.

As illustrated in FIG. 5, the second electric circuit board 10 includes, for example, a polyimide layer 51, a wiring layer 52 provided on the outside surface of the polyimide layer 51, and a wiring layer 53 provided on the inside surface of the polyimide layer 51. In the second electric circuit board 10, the portion corresponding to the second optical element 4 is formed with a through-hole or a transparent window so that optical signals pass therethrough.

The second electric signal wiring 5 is formed on the wiring layer 52 of the outside surface of the polyimide layer 51. The second electric circuit board 10 is adhered to the second surface of the optical waveguide 6 through a bonding sheet 54. The second electric circuit board 10 may be mounted to the electric connector 44 of a board 43 such as, for example, other electric circuit board. The second electric signal wiring 5 is electrically connected to a terminal (not illustrated) within the electric connector 44.

Also, the board 43 on which the second electric circuit board 10 is mounded and the board 41 on which the first electric circuit board 8 is mounted may be the same board. That is, the electric connector 42 may be installed on one side of the same board and the electric connector 44 may be installed on the other side.

The second electric circuit board 10 may be, for example, a flexible printed circuit board having flexibility. When the flexible printed circuit board is used, the degree of freedom of attachment of the second electric circuit board 10 increases so that the second electric circuit board 10 may be mounted to the electric connector 44 regardless of the arrangement of the board 43 and the electric connector 44 where the second electric circuit board 10 is mounted. Since the second electric signal wiring 5 is the same as that described with reference to FIG. 1, the redundant description thereof will be omitted.

A second semiconductor substrate 9 is attached to the second electric signal wiring 5 and the wiring layer 52 of the outside surface of the second electric circuit board 10 via, for example, bumps 55. When the second optical element 4 is a light emitting device, the second semiconductor substrate 9 is attached such that the light emitting portion of the second optical element 4 faces the optical waveguide 6. When the second optical element 4 is a light receiving device, the second semiconductor substrate 9 is attached such that the light receiving portion thereof faces the optical waveguide 6.

The number of the second electric signal wirings 5 equals to, for example, the number of the second optical elements 4. Each of the second electric signal wirings 5 is electrically connected to a corresponding second optical element 4 through the bumps 55. Since the second optical elements 4 are the same as those described with reference to FIG. 1, the redundant description thereof will be omitted.

Each optical waveguide 6 is formed with, for example, a V-shaped recess 26 on the first surface side thereof at a position corresponding to a second optical element 4. In the V-shaped recess 26, the inclined surface where the core 21 is exposed is in contact with, for example, air and forms a second mirror 12 that reflects the optical signal. The second mirror 12 optically couples the second optical element 4 and the optical waveguide 6 with each other.

When the second optical element 4 is a light emitting device, the optical signal emitted from the light emitting portion thereof arrives at the core 21 across the clad 22 of the optical waveguide 6 and is reflected by the second mirror 12 to progress within the core 21. In FIG. 5, the arrow extending from the second mirror 12 to the right side within the core 21 indicates the progressing direction of the optical signal when the second optical element 4 is a light emitting device.

When the second optical element 4 is a light receiving device, the optical signal progressing within the core 21 of the optical waveguide 6 is reflected by the second mirror 12 and arrives at the light receiving portion of the second optical element 4 across the clad 22 of the optical waveguide 6. In FIG. 5, the arrow extending from the second mirror 12 toward the second optical element 4 indicates the progressing direction of the optical signal when the second optical element 4 is a light receiving device. Accordingly, the progressing direction of the optical signal may be turned, for example, 90° by the second mirror 12. Thus, the second optical element 4 and the optical waveguide 6 may be optically coupled with each other.

In the optical module 1, the first optical element 2 may be a light emitting device such as, for example, a VCSEL and the second optical element 4 may be a light receiving device such as, for example, a PD. In addition, both of the first optical element 2 and the second optical element 4 may be a light emitting device such as, for example, a VCSEL. Further, both of the first optical element 2 and the second optical element 4 are a light receiving device such as, for example, a PD.

According to the optical module 1 illustrated in FIGS. 2 to 5, the crosstalk between adjacent first electric signal wirings 3 and the crosstalk between adjacent second electric signal wirings 5 may be suppressed even if the optical waveguides 6 are densified as in the optical module 1 illustrated in FIG. 1. Accordingly, an optical module having an improved electric characteristic may be obtained.

Example of Optical Waveguide Manufacturing Sequence

Figure 6:
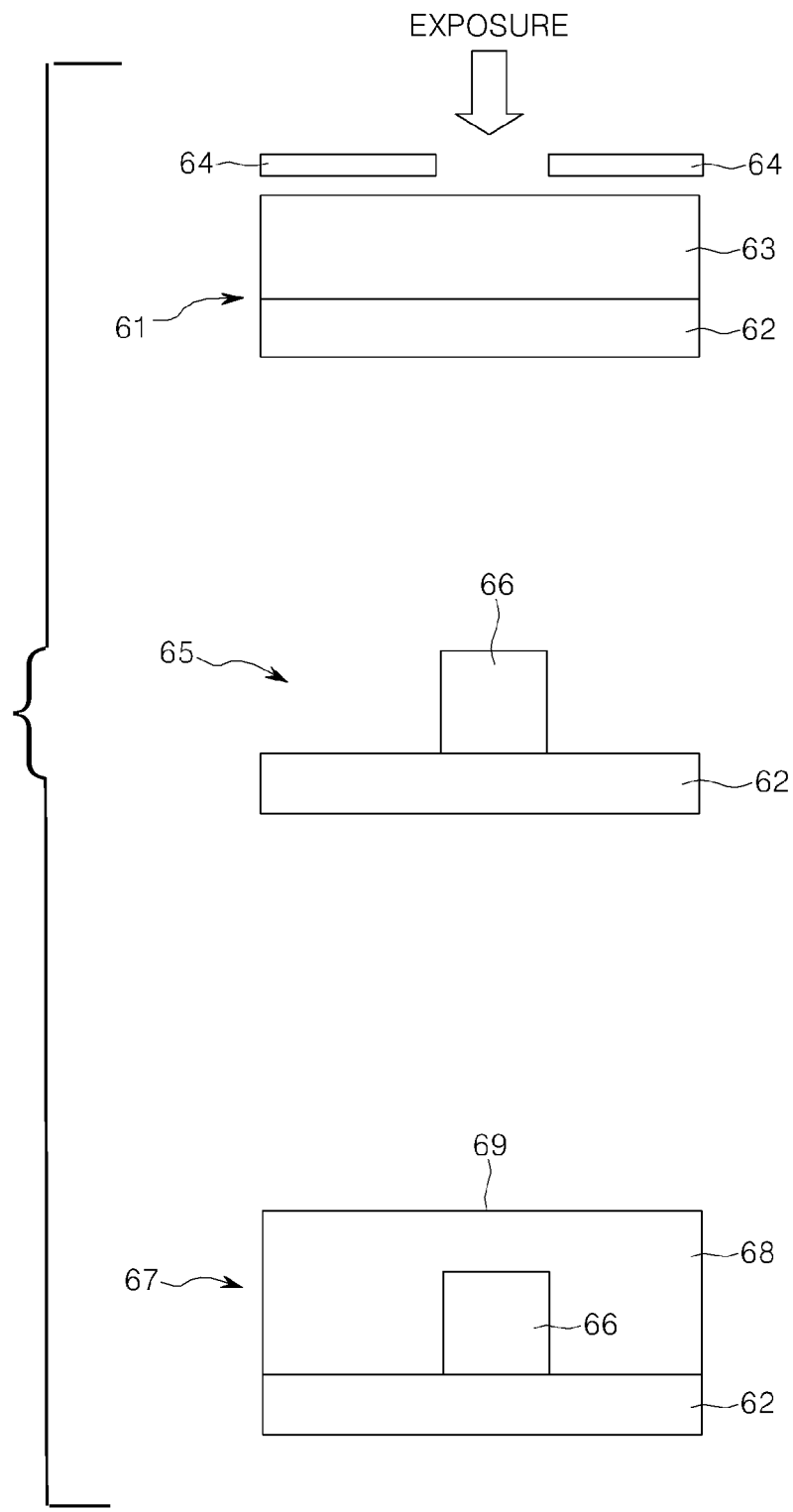
FIG. 6 is a view illustrating an exemplary manufacturing sequence of an optical waveguide of an optical module according to an exemplary embodiment.

FIG. 6 is a view illustrating an example of a manufacturing sequence of an optical waveguide of an optical module according to an exemplary embodiment. As illustrated in FIG. 6, in exposure process 61, the bottom clad layer 62 is laminated and the core layer 63 is laminated first to integrate the bottom clad layer 62 and the core layer 63. Then, a portion of the core layer 63 which will become the core is exposed using a mask 64.

Subsequently, in a developing process 65, the core layer 63 is removed to leave the exposed portion of the core layer 63 by the developing process, thereby forming the core 66. Subsequently, in a top clad forming process 67, a top clad layer 68 is laminated above the bottom clad layer 62 and the core 66 to integrate the bottom clad layer 62, the core 66, and the top clad layer 68.

Then, a baking process is performed. Thus, the refractive index of the core 66 becomes larger than the refractive indexes of the bottom clad layer 62 and the top clad layer 68 and thus, an optical waveguide 69 may be obtained. The optical waveguide 69 corresponds to, for example, the optical waveguide 6 illustrated in FIG. 4 or FIG. 5. The bottom clad layer 62, the core 66 and the top clad layer 68 may correspond to, for example, the clad 22, the core 21 and the clad 23 of the optical waveguide 6 illustrated in FIG. 4 or FIG. 5, respectively.

First Example of Mirror Manufacturing Process

Figure 7:
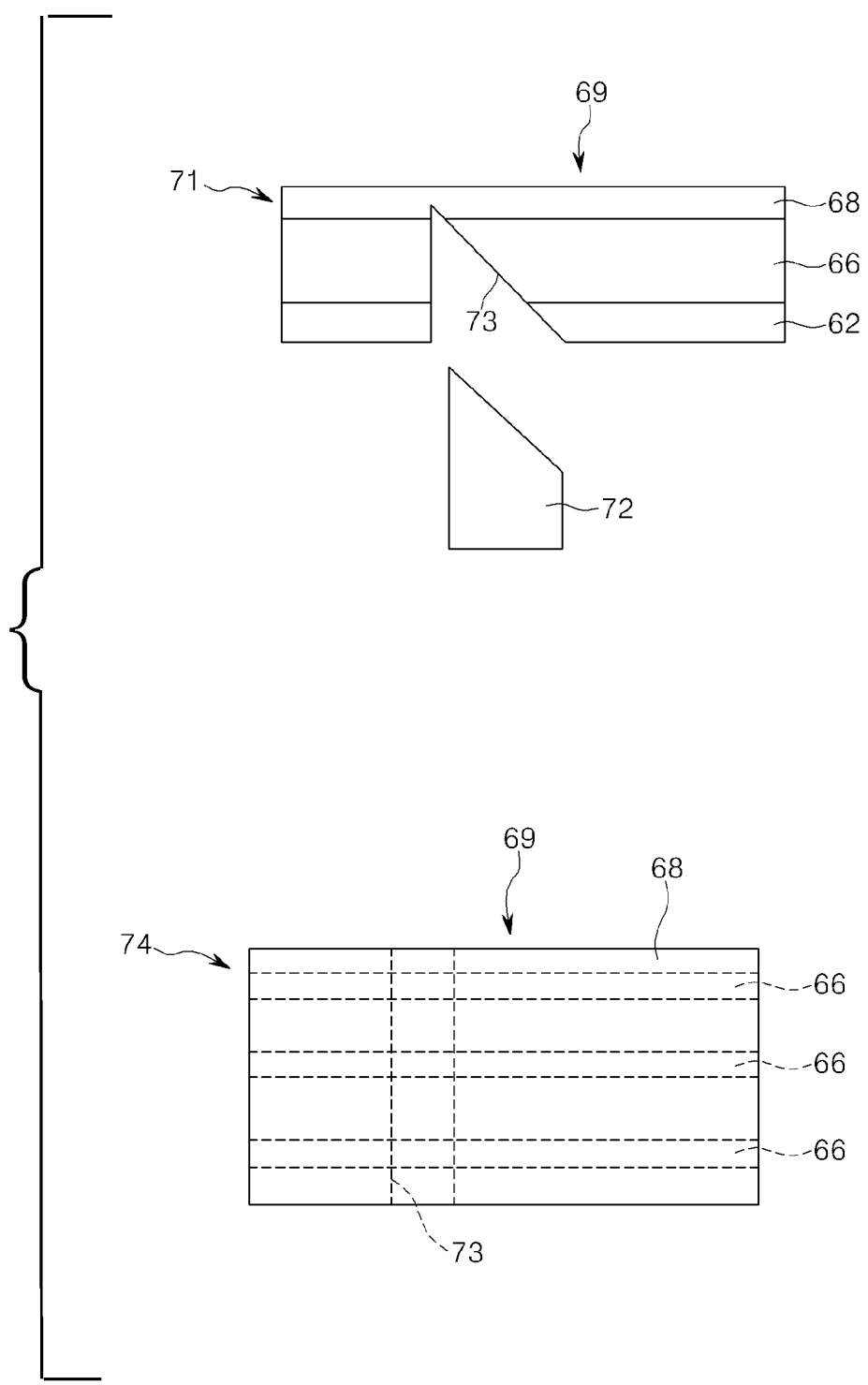
FIG. 7 is a view illustrating a first example of a process of manufacturing a mirror of an optical module according to an exemplary embodiment.

FIG. 7 is a view illustrating a first example of a process of manufacturing a mirror of an optical module according to an exemplary embodiment. As illustrated in FIG. 7, in a dicing process 71, a recess 73 may be formed by cutting the optical waveguide 69 using a blade 72 of which the leading end is inclined at an angle of, for example, 45°. As illustrated in the top plan view 74 of FIG. 7, the recess 73 is formed to cross the optical waveguide 69. The recess 73 corresponds to, for example, the recess 25, 26 illustrated in FIG. 4 or FIG. 5 and the inclined surface of the recess 73 forms, for example, the first mirror 11 or the second mirror 12 illustrated in FIG. 4 or FIG. 5.

Second Example of Mirror Manufactruing Process

Figure 8:
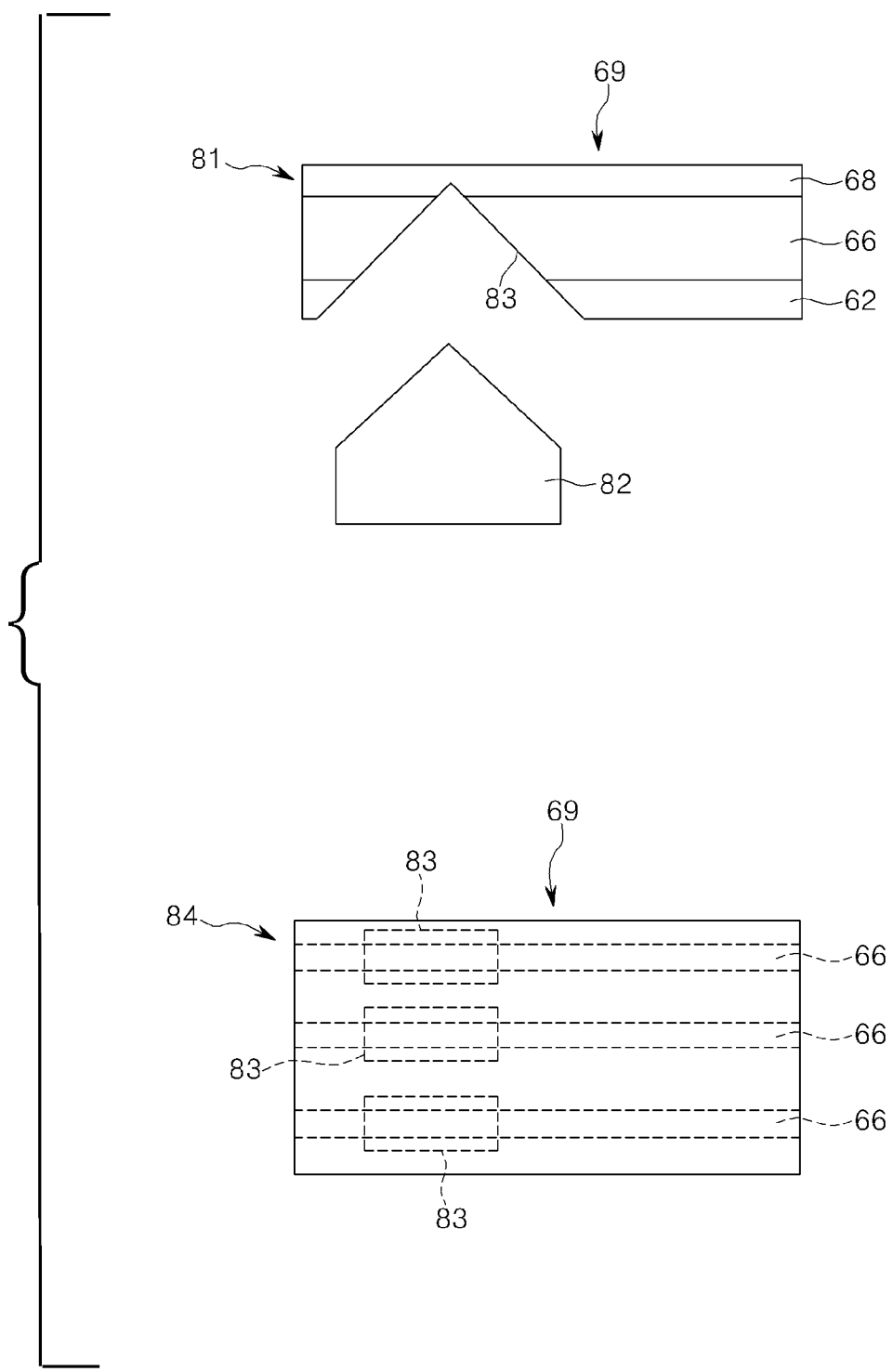
FIG. 8 is a view illustrating a second example of a process of manufacturing a mirror of an optical module according to an exemplary embodiment.

FIG. 8 is a view illustrating a second example of a method of manufacturing a mirror of an optical module according to an exemplary embodiment. As illustrated in FIG. 8, in a stamper process 81, the recess 83 may be formed by urging a stamper 82 having, for example, a 45° mirror shape at the leading end against the optical waveguide 69. As illustrated in the top plan view 84 of FIG. 8, the recess 83 may be formed on each channel of optical waveguide 69 (e.g., on each core 66) by using a stamper 82 of a small size. The recess 83 becomes, for example, the recess 25, 26 illustrated in FIG. 4 or FIG. 5 and an inclined surface of the recess 83 forms, for example, the first mirror 11 or the second mirror 12 illustrated in FIG. 4 or FIG. 5.

Third Example of Mirror Manumacturing Process

Figure 9:
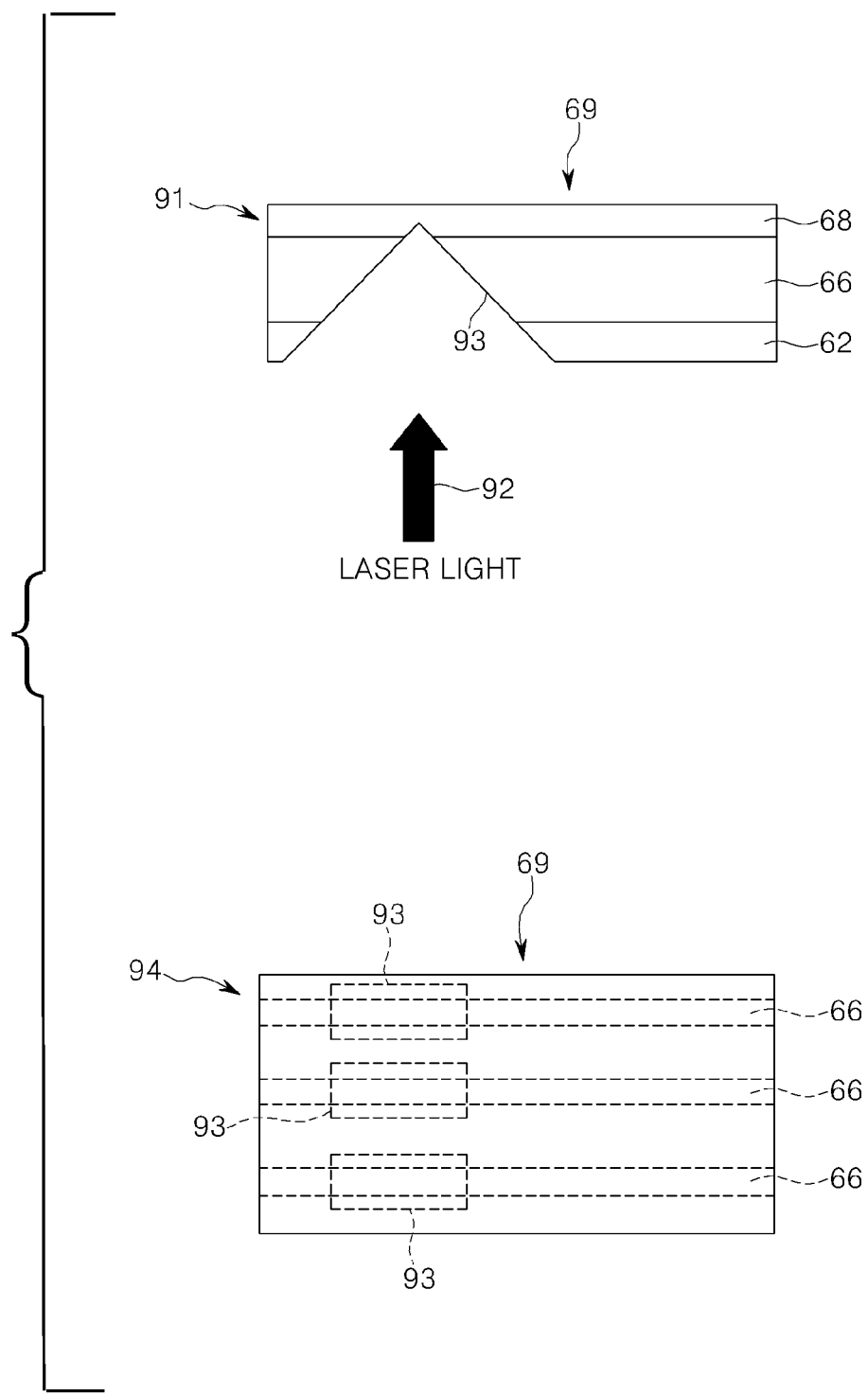
FIG. 9 is a view illustrating a third example of a process of manufacturing a mirror of an optical module according to an exemplary embodiment.

FIG. 9 is a view illustrating a third example of a process of manufacturing a mirror of an optical module according to an exemplary embodiment. As illustrated in FIG. 9, in a laser machining process 91, a recess 93 may be formed by irradiating a laser light 92 to an optical waveguide 69 to cut the optical waveguide 69 by laser ablation. As illustrated in the top plan view 94 of FIG. 9, the recess 93 may be formed on each channel of the optical waveguide 69 (e.g., on each core 66). The recess 93 corresponds to, for example, the recess 25, 26 illustrated in FIG. 4 or FIG. 5 and an inclined surface of the recess 93 forms, for example, the first mirror 11 or the second mirror 12 illustrated in FIG. 4 or FIG. 5.

Example of Optical Module Manufacturing Sequence

Figure 10:
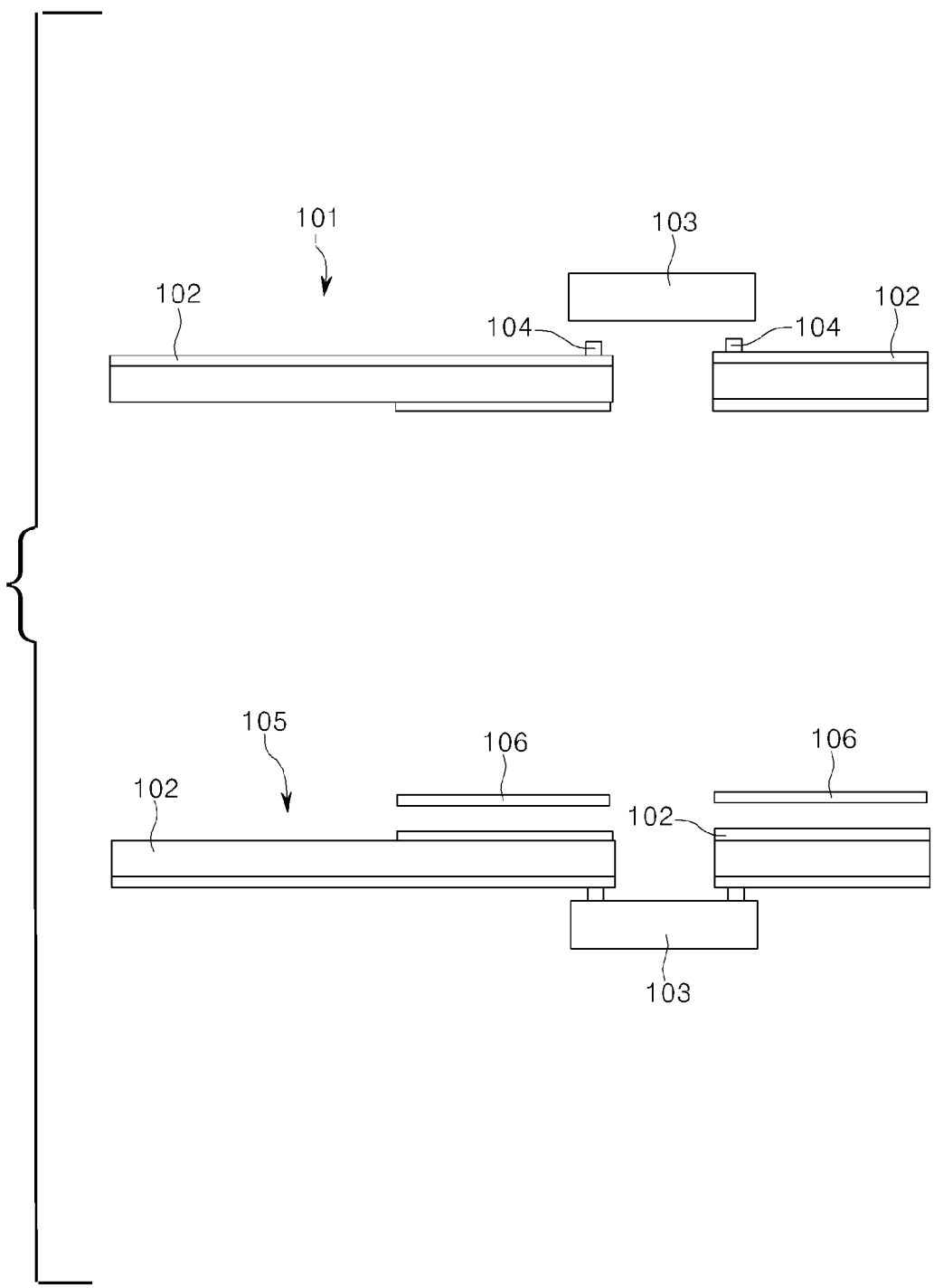
FIG. 10 is a view illustrating a manufacturing sequence of an optical module according to an exemplary embodiment.
Figure 11:
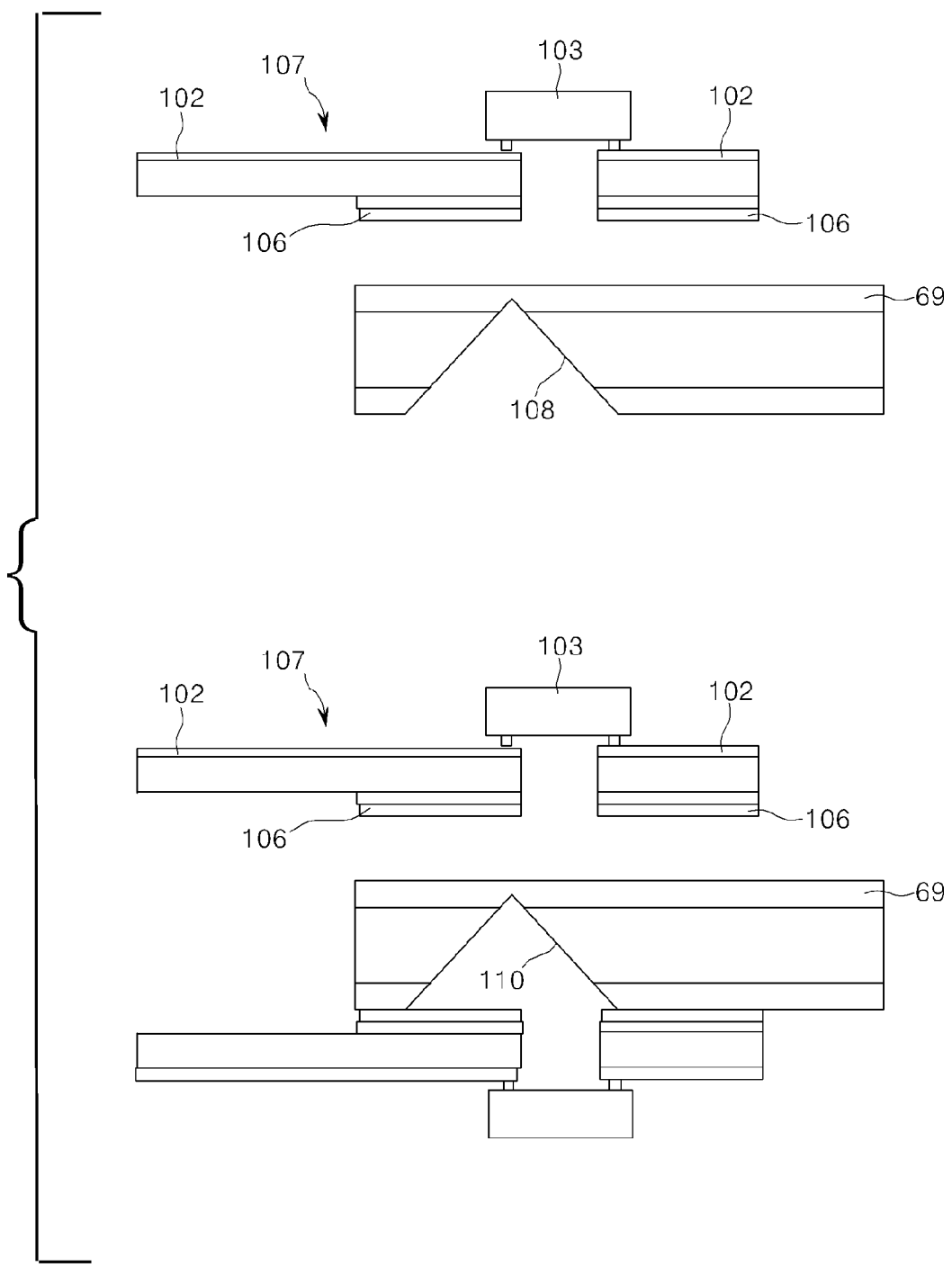
FIG. 11 is a view continued from FIG. 10.

FIG. 10 illustrates an example of a manufacturing sequence of an optical module according to an exemplary embodiment. FIG. 11 is a view continued from FIG. 10. As illustrated in FIG. 10, in an optical element mounting process 101, an electric signal wiring and an electrode are formed on the outside surface and the inside surface of an electric circuit board 102 such as, for example, a flexible printed circuit board. When the flexible printed circuit board is used, the electric signal wiring and the electrode may be formed by a lithography technology using an exposure process, a developing process and an etching process. In addition, a hole may be formed through a polyimide layer by etching or laser machining.

A semiconductor substrate 103 including an optical element is flip-chip-disposed on the outside surface of an electric circuit board 102 including an electric signal wiring of a desired pattern and an electrode, using bumps 104. The bumps 104 may be, for example, Au bumps or solder bumps. In the case of Au bumps, the semiconductor substrate 103 may be adhered to the electric circuit board 102 by performing the position alignment of the optical element using a camera, then bringing the electric circuit board 102 into close contact with the semiconductor substrate 103, and then vibrating the semiconductor substrate 103, using ultrasonic waves.

In the case of solder bumps, the semiconductor substrate 103 may be adhered to the electric circuit board 102 by performing the position alignment of the optical element using a camera, then bringing the semiconductor substrate 103 into close contact with the electric circuit board 102, and then heating the semiconductor substrate 103. The electric circuit board 102 corresponds to, for example, the first electric circuit board 8 or the second electric circuit board 10 illustrated in FIG. 4 or FIG. 5. The semiconductor substrate 103 corresponds to, for example, the first semiconductor substrate 7 or the second semiconductor substrate 9 illustrated in FIG. 4 or FIG. 5. The bumps 104 correspond to, for example, the bumps 35 or the bumps 55 illustrated in FIG. 4 or FIG. 5.

In a bonding sheet mounting process 105, a portion of the bonding sheet 106 corresponding to the optical element is removed in advance by, for example, die cutting. When the bonding sheet 106 is transparent, the portion corresponding to the optical element may not be removed. The boning sheet 106 is pre-bonded to the inside surface of the electric circuit board 102 including the semiconductor substrate 103 by heating the bonding sheet 106 using, for example, a flip chip bonder or a die bonder. The bonding sheet 106 corresponds to, for example, the bonding sheet 34 or the bonding sheet 54 illustrated in FIG. 4 or FIG. 5.

As illustrated in FIG. 11, in a first electric circuit board mounting process 107, the position alignment of the electric circuit board 102 is performed such that the mirror 108 of the optical waveguide 69 and the optical element of the semiconductor substrate 103 are positionally aligned with each other. Then, the bonding sheet 106 on the inside surface of the electric circuit board 102 is pre-bonded to one side surface of the wave guide 69 while heating the electric circuit board 102 using, for example, a flip chip bonder. The mirror 108 corresponds to, for example, the first mirror 11 illustrated in FIG. 4 or FIG. 5.

In a second electric circuit board mounting process 109, the position alignment of the electric circuit board 102 is performed such that the mirror 110 of the optical waveguide 69 and the optical element of the semiconductor substrate 103 are positionally aligned with each other. Then, as in the first electric circuit board mounting process 107, the bonding sheet 106 on the inside surface of the electric circuit board 102 is pre-bonded to the other side surface of the optical waveguide 69. The mirror 110 corresponds to, for example, the second mirror 12 illustrated in FIG. 4 or FIG. 5.

After the second electric circuit board mounting process 109, the bonding sheet 106 is cured by performing a baking. Through the processes as described above, the optical module is completed. In addition, the above-described manufacturing sequence of the optical module is an example, and may be properly changed.

Third Exemplary Embodiment of Optical Module

Figure 12:
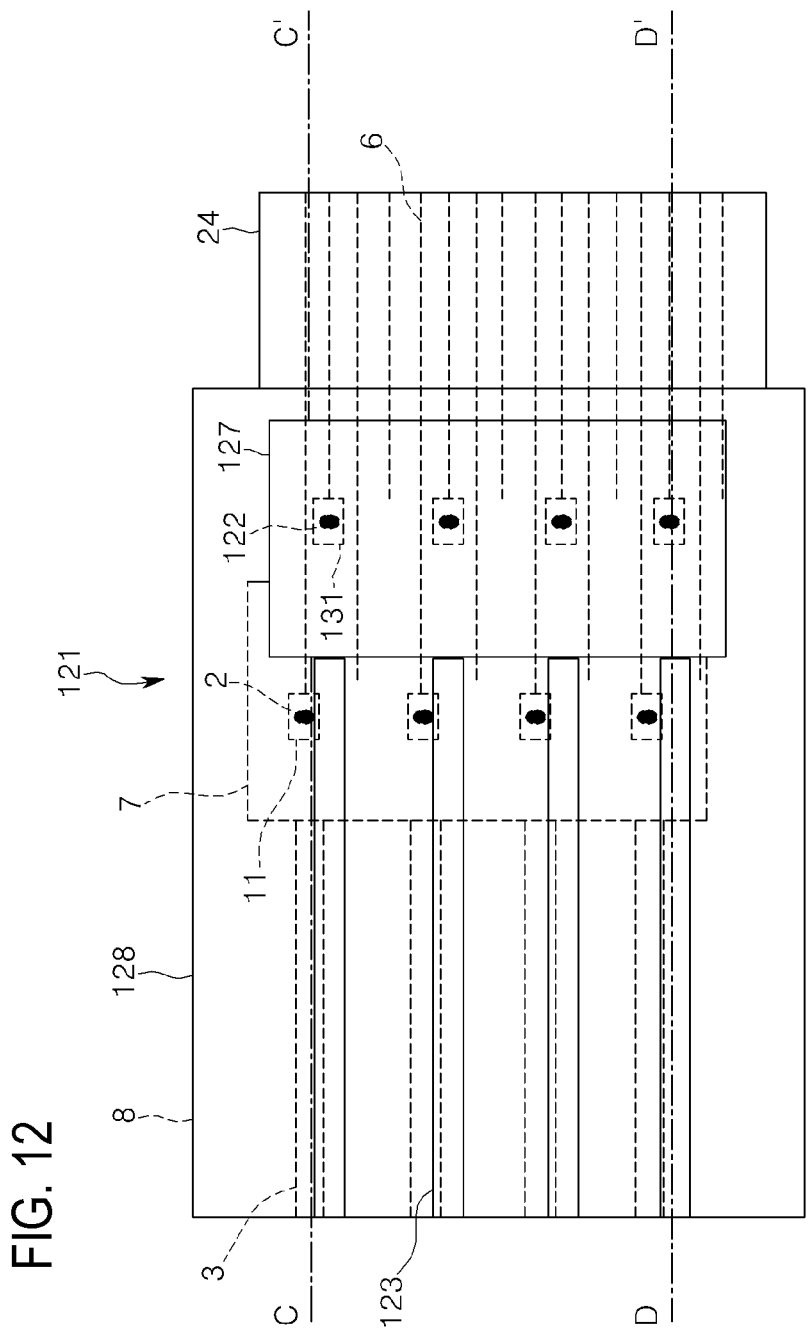
FIG. 12 is a top plan view illustrating an optical module according to a third exemplary embodiment.
Figure 13:
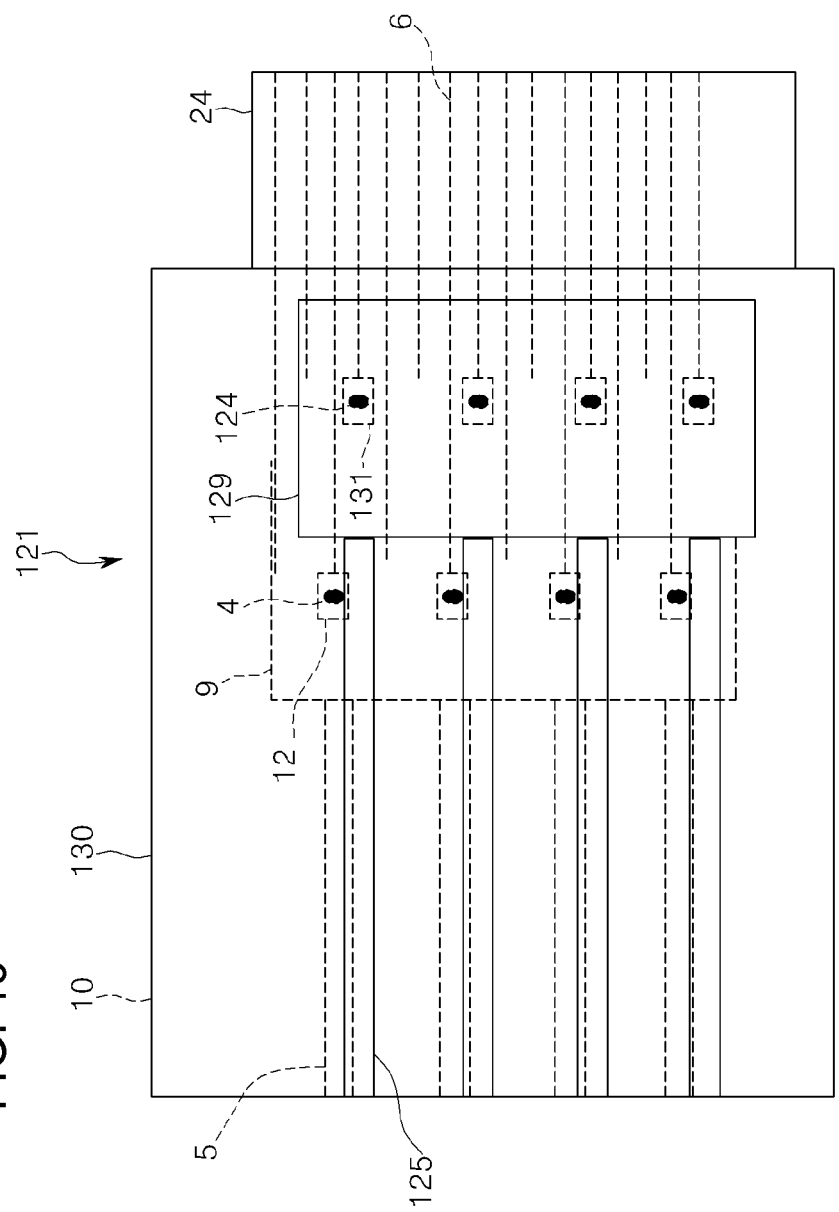
FIG. 13 is a bottom view illustrating the optical module according to the third modified embodiment.
Figure 14:
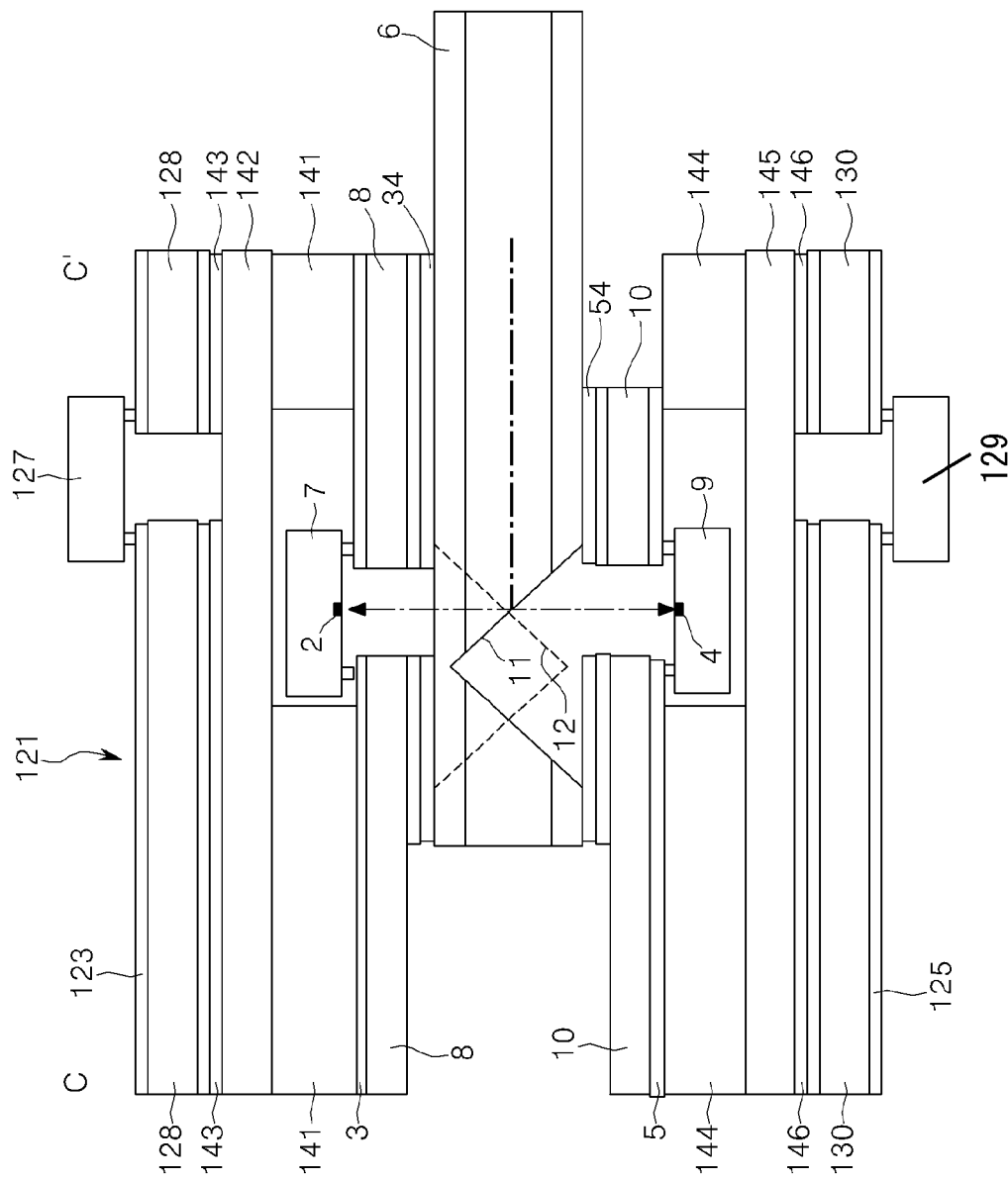
FIG. 14 is a cross-sectional view taken along the cut-line C-C' of FIG. 12.
Figure 15:
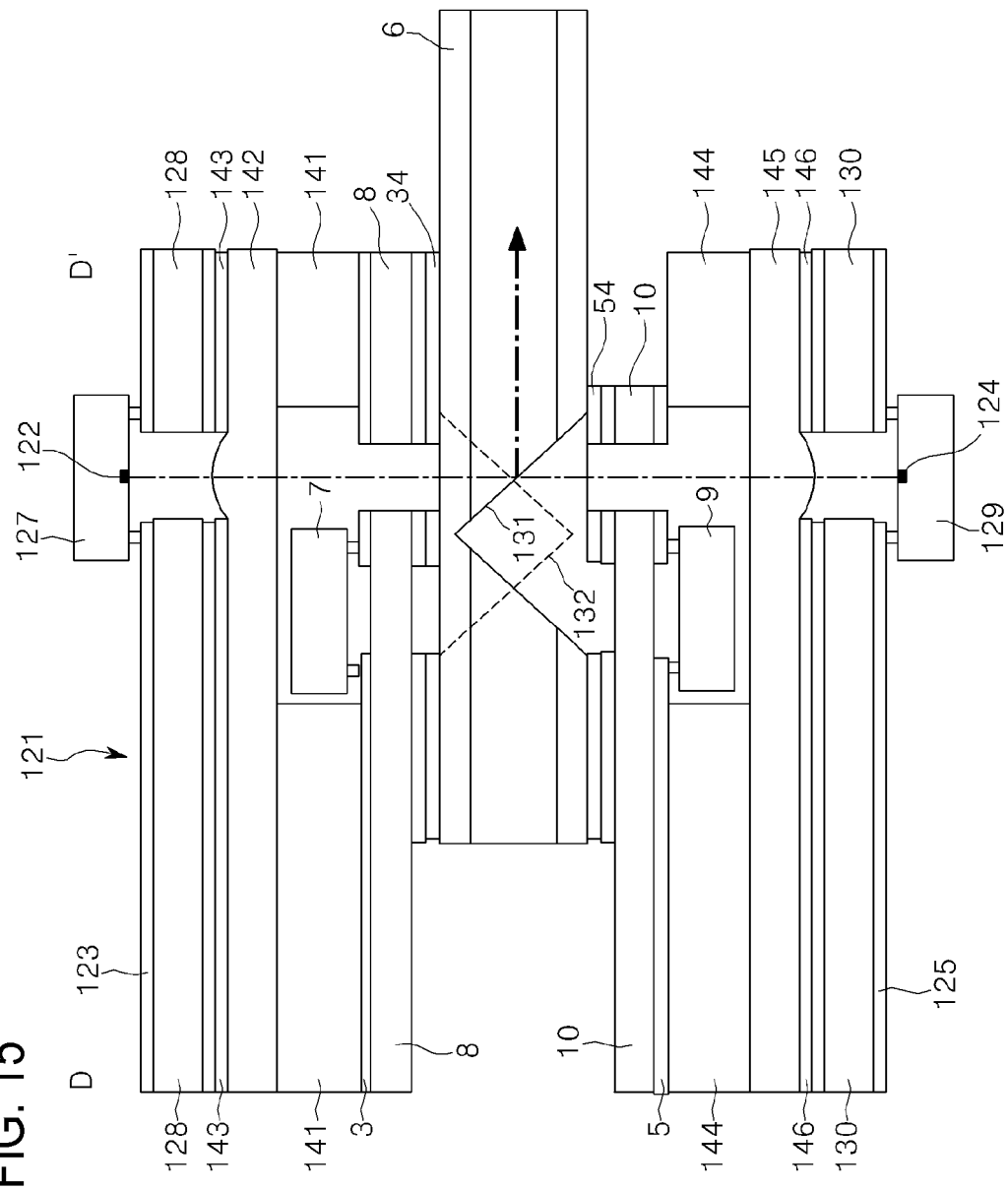
FIG. 15 is a cross-sectional view taken along the cut-line D-D' of FIG. 12.

FIG. 12 is a top plan view illustrating an optical module according to a third exemplary embodiment. FIG. 13 is a bottom view illustrating the optical module according to the third exemplary embodiment. FIG. 14 is a cross-sectional view taken along the cut-line C-C' of FIG. 12. The cut-line C-C' passes through the first electric signal wirings 3 and the first optical elements 2. FIG. 15 is a cross-sectional view taken along the cut-line D-D' of FIG. 12. The cut-line D-D' passes through a third electric signal wiring 123 and a third optical element 122.

As illustrated in FIGS. 12 to 15, the optical module 121 includes plural layers (e.g., two layers) of electric circuit boards 8, 128 on the first surface side of the optical waveguides 6 and includes plural layers (e.g., two layers) of electric circuit boards 10, 130 on the second surface side of the optical waveguides 6. Alternatively, three or more layers of electric circuit boards may be provided on any one of the first surface side and the second surface side of the optical waveguides 6. In the present exemplary embodiment, descriptions will be made on a case in which two layers of electric circuit boards are installed on each of the first surface side and the second surface side of the optical waveguides 6.

The first electric circuit board 8 is disposed on the first surface of the optical waveguides 6 through a bonding sheet 34. A thickness adjustment layer 141 is provided on the first electric circuit board 8 and a lens sheet 142 is provided on the thickness adjustment layer 141. In addition, the third electric circuit board 128 is disposed on the lens sheet 142 through the bonding sheet 143.

On the first electric circuit board 8, the first semiconductor substrate 7 including the first optical elements 2 is mounted. In the optical waveguides 6, first mirrors 11 are provided at the positions corresponding to the first optical element 2, respectively. The first electric circuit board 8, the first electric signal wirings 3, the first optical elements 2, the first semiconductor substrate 7, and the first mirrors 11 are the same as those described with reference to FIGS. 2 to 5, and thus, the redundant descriptions thereof will be omitted.

On the third electric circuit board 128, a third semiconductor substrate 127 including third optical elements 122 is mounted. In the optical waveguides 6, third mirrors 131 are provided at the positions corresponding to the third optical elements 122, respectively. On the outside surface of the third electric circuit board 128, the third electric signal wirings 123 are provided.

The third electric signal wirings 123 transmit an electric signal input to the third optical elements 122 when the third optical elements 122 are light emitting devices, or transmit an electrical signal output from the third optical elements 122 when the third optical elements 122 are light receiving devices. Similarly to the first electric signal wirings 3, the third electric signal wirings 123 are disposed side by side in parallel with each other in a direction intersecting with the transmission direction of the electric signal transmitted by the third electric signal wirings 123. As illustrated in FIG. 12, the third electric signal wirings 123 form the rows in the up and down direction of the drawing in FIG. 12.

In the lens sheet 142, the portions corresponding to the third optical elements 122 are formed in a lens shape. Thus, when the third optical elements 122 are light emitting devices, light beams emitted from the third optical element 122 and incident on the optical waveguides 6 converge. When the third optical elements 122 are light receiving devices, the light beams emitted from the optical waveguides 6 and incident on the third optical elements 122 converge.

In addition, when the light beams diverge within a tolerable range even if no lens exists, the lens sheet 142 may be omitted. Since the third electric circuit board 128, the third electric signal wirings 123, the third optical elements 122, the third semiconductor substrate 127, and the third mirrors 131 are the same as the first electric circuit board 8, the first electric signal wirings 3, the first optical elements 2, the first semiconductor substrate 7, and the first mirrors 11, respectively, the descriptions thereof will be omitted.

The second electric circuit board 10 is disposed on the second surface of the optical waveguides 6 through the bonding sheet 54. A thickness adjustment layer 144 is provided on the second electric circuit board 10, and a lens sheet 145 is provided on the thickness adjustment layer 144. In addition, a fourth electric circuit board 130 is disposed on the lens sheet 145 through a bonding sheet 146.

A second semiconductor substrate 9 including second optical elements 4 is disposed on the second electric circuit board 10. In the optical waveguides 6, second mirrors 12 are provided at the positions corresponding to the second optical elements 4, respectively. Since the second electric circuit board 10, the second electric signal wirings 5, the second optical elements 4, the second semiconductor substrates 9, and the second mirrors 12 are the same as those described with reference to FIGS. 2 to 5, the redundant descriptions thereof will be omitted.

A fourth semiconductor substrate 129 including fourth optical elements 124 is disposed on the fourth electric circuit board 130. In the optical waveguides 6, fourth mirrors 132 are provided at the positions corresponding to the fourth optical elements 124, respectively. On the outside surface of the fourth electric circuit board 130, fourth electric signal wirings 125 are provided.

The fourth electric signal wirings 125 transmit an electric signal input to the fourth optical elements 124 when the fourth optical elements 124 are light emitting devices, or transmit an electric signal input to the fourth optical elements 124 when the fourth optical elements 124 are light receiving devices. Similarly to the second electric signal wirings 5, the fourth electric signal wirings 125 are disposed side by side in parallel with each other in a direction intersecting with the transmission direction of the electric signal transmitted by the fourth electric signal wirings 125. As illustrated in FIG. 13, the fourth electric signal wirings 125 form the rows in the up and down direction of the drawing in FIG. 13.

In the lens sheet 145, the portions corresponding to the fourth optical elements 124 are formed in a lens shape. Thus, when the fourth optical elements 124 are light emitting devices, light beams emitted from the fourth optical elements 124 and incident on the optical waveguides 6 converge. When the fourth optical elements 124 are light receiving devices, light beams emitted from the optical waveguides 6 and incident on the fourth optical elements 124 converge.

Further, when the light beams diverge within a tolerable range even if no lens exists, the lens sheet 145 may be omitted. Since the fourth electric circuit board 130, the fourth electric signal wirings 125, the fourth optical elements 124, the fourth semiconductor substrate 129, and the fourth mirrors 132 are the same as the second electric circuit board 10, the second electric signal wirings 5, the second optical elements 4, the second semiconductor substrate 9, and the second mirrors 12, respectively, the descriptions thereof will be omitted.

In FIG. 14, the first optical element 2 and the first electric signal wiring 3 on the first surface side of the optical waveguide 6 and the second optical element 4 and the second electric signal wiring 5 on the second surface side of the optical waveguide 6 are illustrated in the same cross-section. However, they are actually offset from each other in the depth direction of the drawing in FIG. 14. Similarly, in FIG. 15, the third optical element 122 and the third electric signal wiring 123 on the first surface side of the optical waveguide 6, and the fourth optical element 124 and the fourth electric signal wiring 125 on the second surface side of the optical waveguide 6 are illustrated in the same cross-section. However, they are actually offset from each other in the depth direction of the drawing in FIG. 15.

Further, as will be apparent when FIG. 12 is compared with FIG. 13, the first electric signal wirings 3 and the second electric signal wirings 5 are alternately disposed. The third electric signal wirings 123 and the fourth electric signal wirings 125 are alternately disposed. The first electric signal wirings 3, the second electric signal wirings 5, the third electric signal wirings 123, and the fourth electric signal wirings 125 are disposed not to overlap each other.

Similarly, the first optical elements 2, the second optical elements 4, the third optical elements 122, and the fourth optical elements 124 are also disposed not to overlap each other. The interval between adjacent optical waveguides 6 is narrower than the interval between adjacent first electric signal wirings 3, the interval between adjacent second electric signal wirings 5, the interval between adjacent third electric signal wirings 123, and the interval between adjacent fourth electric signal wirings 125.

In the optical module 121, the first optical elements 2 may be a light emitting device such as, for example, a VCSEL, or a light receiving device such as, for example, a PD. Similarly, the second optical elements 4, the third optical elements 122, and fourth optical elements 124 may be a light emitting device such as, for example, a VCSEL, or a light receiving device such as, for example, a PD. When the heat dissipation efficiency of the inner electric circuit boards (e.g., the first electric circuit board 8 and the second electric circuit board 10) is inferior to that of the outer electric circuit boards (e.g., the third electric circuit board 128 and the fourth electric circuit board 130), the first optical elements 2 and the second optical elements 4 may be a light receiving device such as, for example, a PD.

According to the optical module 121 illustrated in FIGS. 12 to 15, the optical waveguides 6 may be further densified. In such a case, the crosstalk between adjacent first electric signal wirings 3, the crosstalk between adjacent second electric signal wirings 5, the crosstalk between adjacent third electric signal wirings 123, and the crosstalk between adjacent fourth electric signal wiring 125 may be suppressed. Accordingly, an optical module having an improved electric characteristic may be obtained.

Fourth Exemplary Embodiment of Optical Module

Figure 16:
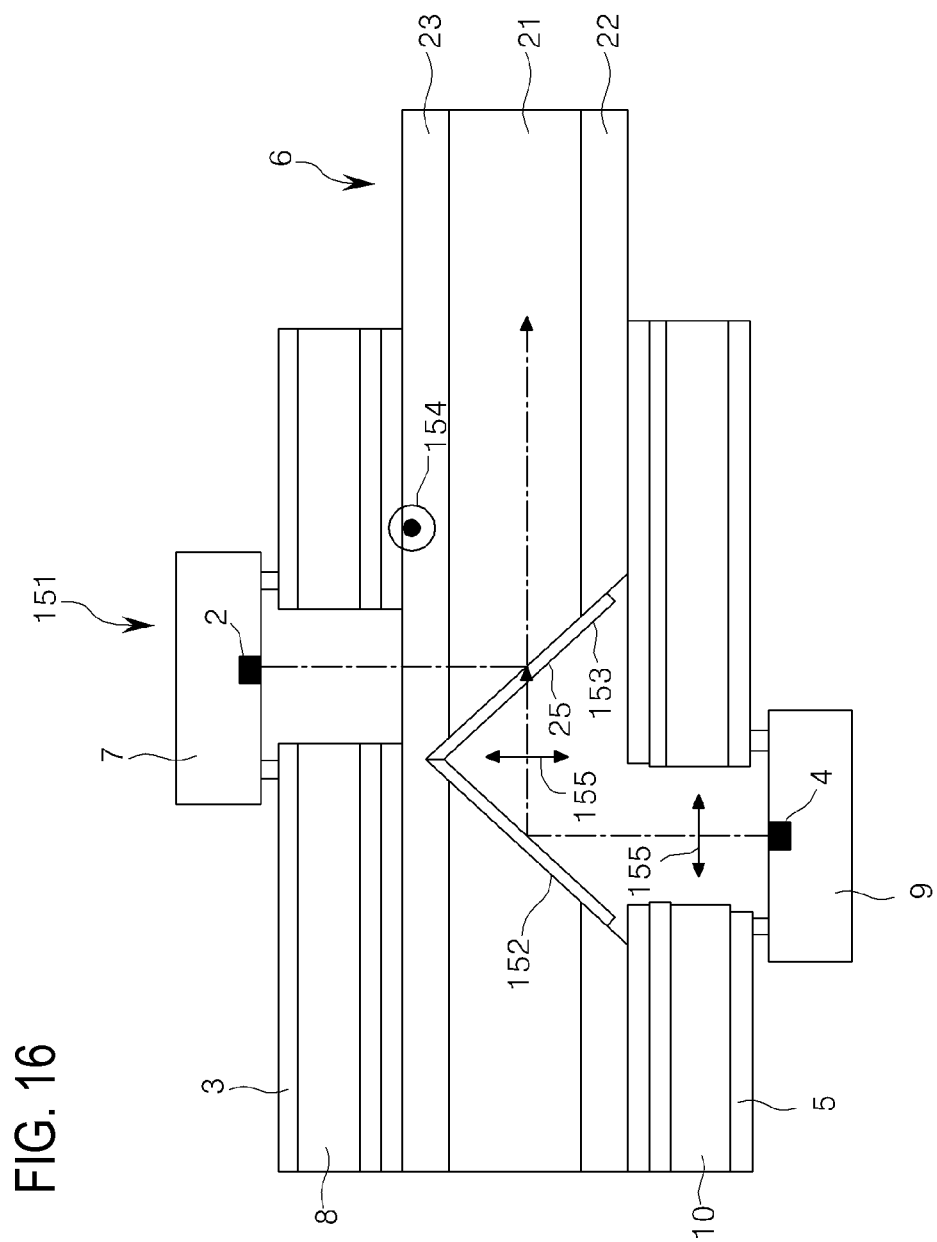
FIG. 16 is a top plan view illustrating an optical module according to a fourth exemplary embodiment.

FIG. 16 is a top plan view illustrating an optical module according to a fourth exemplary embodiment. As illustrated in FIG. 16, in an optical module 151, a first optical element 2 and a second optical element 4 are disposed to be offset with each other in the wave guide direction of an optical signal wave-guided by an optical waveguide 6. In addition, the polarizing direction of an optical signal emitted from the first optical element 2 or an optical signal incident on the first optical element 2, and the polarizing direction of an optical signal emitted from the second optical element 4 or an optical signal incident on the second optical element 4, are orthogonal to each other.

For example, the beams of the optical signal emitted from the first optical element 2 or the optical signal incident on the first optical element 2 may be S-polarized light. For example, the beams of an optical signal emitted from the second optical element 4 or an optical signal incident on the second optical element 4 may be P-polarized light. In order to develop such polarization states, the polarization states may be controlled, for example, by providing a polarizer inside or outside of the light emitting device.

In FIG. 16, an outline circle indicated with a black circle therein and denoted by symbol 154 represents that the polarizing direction is in the depth direction of the drawing. In addition, in FIG. 16, arrow 155 represents that the polarizing direction is in an in-plane direction.

The optical waveguide 6 is formed with a V-shaped recess 25 on the second surface side of the optical waveguide 6. In the two inclined surfaces of the recess 25, the inclined surface corresponding to the second optical element 4 is provided with a reflective film 152. The reflective film 152 may be formed by depositing a metal such as, for example, gold, silver or aluminum to a thickness of, for example, about 1000 Å to about 1 μm. When the second optical element 4 is a light emitting device, an optical signal emitted from the second optical element is totally reflected by the reflective film 152 to progress toward the optical waveguide 6, and when the second optical element 4 is a light receiving device, an optical signal emitted from the optical waveguide 6 is totally reflected to progress toward the second optical element 4.

In the two inclined surfaces of the recess 25, the inclined surface corresponding to the first optical element 2 is provided with a polarizing beam splitter 153. The polarizing beam splitter 153 may be formed by depositing and laminating two layers of films such as, for example, $SiO_2$ and $MgF_2$, having different refractive indexes. When the first optical element 2 is a light emitting device, the optical signal emitted from the first optical element 2 is totally reflected by the polarizing beam splitter 153 to progress within the optical waveguide 6, and when the first optical element 2 is a light receiving device, the optical signal progressing within the optical waveguide 6 is totally reflected to progress toward the first optical element 2.

In addition, when the second optical element 4 is a light emitting device, the optical signal emitted from the second optical element 4 and totally reflected by the reflective film 152 to progress toward the optical waveguide penetrates the polarizing beam splitter 153 and progresses within the optical waveguide 6. When the second optical element 4 is a light receiving device, the optical signal progressing within the optical waveguide 6 penetrates the polarizing beam splitter 153 and progresses toward the reflective film 152. Then, the optical signal is totally reflected by the reflective film 152 to progress toward the second optical element 4.

In FIG. 16, the first optical element 2 and the first electric signal wiring 3 on the first surface side of the optical waveguide 6 and the second optical element 4 and the second electric signal wiring 5 on the second surface side of the optical waveguide 6 are illustrated in the same cross-section. However, they are actually offset with each other in the depth direction of the drawing in FIG. 16.

According to the optical module 151 illustrated in FIG. 16, the V-shaped recess 25 may be formed on the second surface side of the optical waveguide 6 without forming the V-shaped recess on the first surface side. Accordingly, the process of forming recesses in the optical waveguides 6 may be shortened by half.

First Mounting Example of Optical Module

Figure 17:
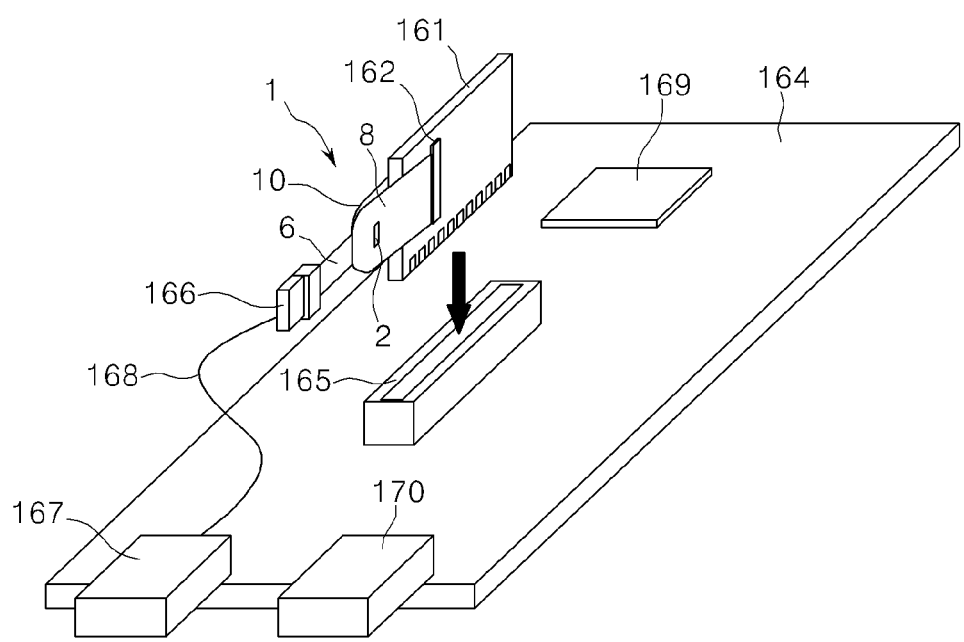
FIG. 17 is a view illustrating a first mounting example of an optical module according to an exemplary embodiment.
Figure 18:
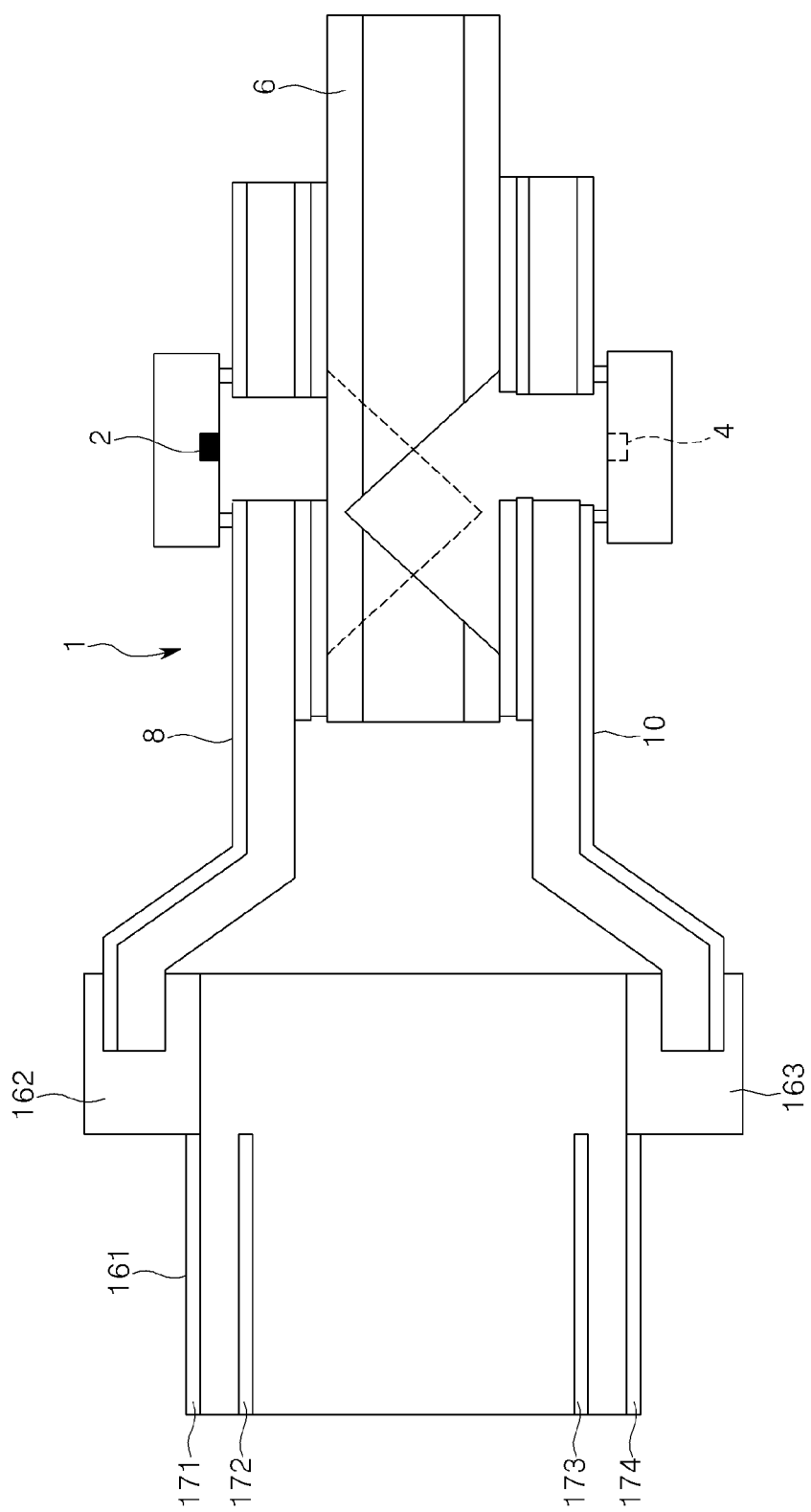
FIG. 18 is a cross-sectional view illustrating the cross-section made through the optical module in the mounting example illustrated in FIG. 17.

FIG. 17 is a view illustrating a first mounting example of an optical module according to an exemplary embodiment. FIG. 18 is a cross-sectional view illustrating a cross-section made through the optical module in the mounting example illustrated in FIG. 17. As illustrated in FIG. 17 and FIG. 18, the first electric circuit board 8 including the first optical element 2 of the optical module 1 may be mounted to the electric connector 162 installed on one side surface of the sub-board 161. The second electric circuit board 10 including the second optical element 4 of the optical module 1 may be mounted to the electric connector 163 installed on the other side surface of the sub-board 161.

The sub-board 161 may be mounted in a standing state to the electric connector 165 installed on the server board 164. The optical connector 166 may be provided at the leading end of the optical waveguides 6 of the optical module 1, and the optical connector 167 installed on the server board 164 may be connected with the optical connector through an optical fiber such as the optical wiring 168. The server board 164 may be mounted with an integrated circuit 169 configured to control the signal processing of a transmission signal and a reception signal, or to control the circuit of the optical module 1. The server board 164 may be mounted with an electric connector 170. The sub-board 161 may be a multi-layer wiring board including a plurality of wiring layers 171, 172, 173, 174.

According to the mounting example illustrated in FIG. 17, as the optical module 1 is mounted to the server board 164, the wiring length between the optical module 1 and the integrated circuit 169 may be reduced and a high speed communication system may be implemented. In addition, since the number of optical connectors 167 installed on the server board 164 is reduced by half, the prices of apparatuses such as a server to which an optical wiring technology is applied or a peripheral which is connected to the server by the optical wiring technology, may be lowered. Further, since the server board 164 is mounted to the sub-board 161 in the standing state, the occupying region of the optical module 1 on the server board 164 may be reduced.

Second Mounting Example of Optical Module

Figure 19:
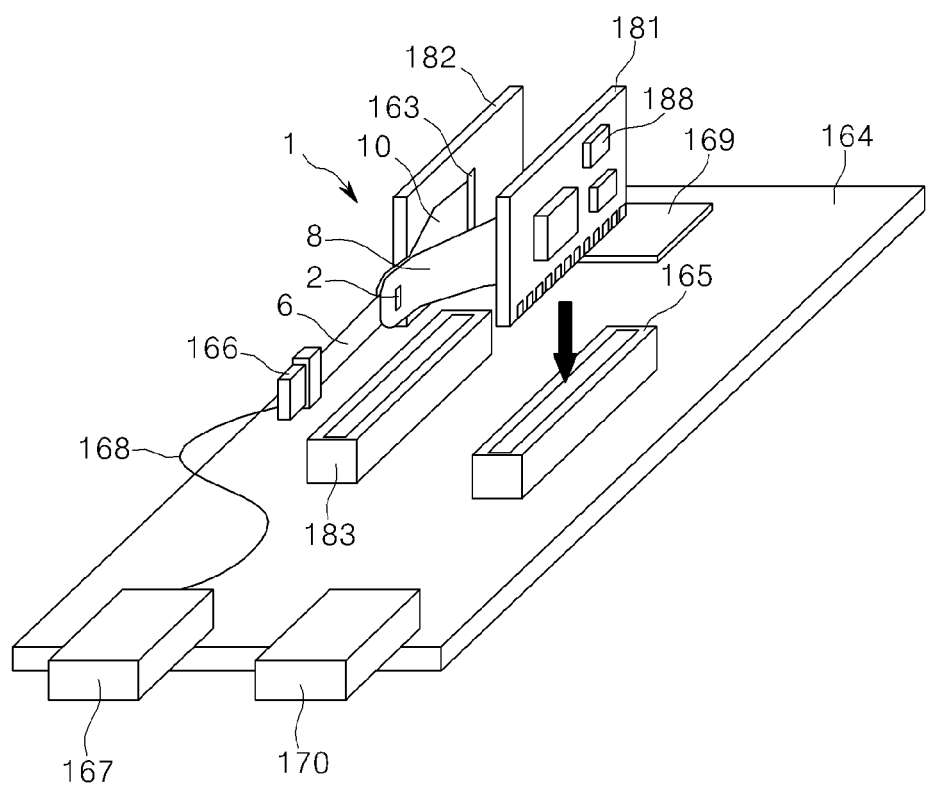
FIG. 19 is a second mounting example of an optical module according to an exemplary embodiment.
Figure 20:
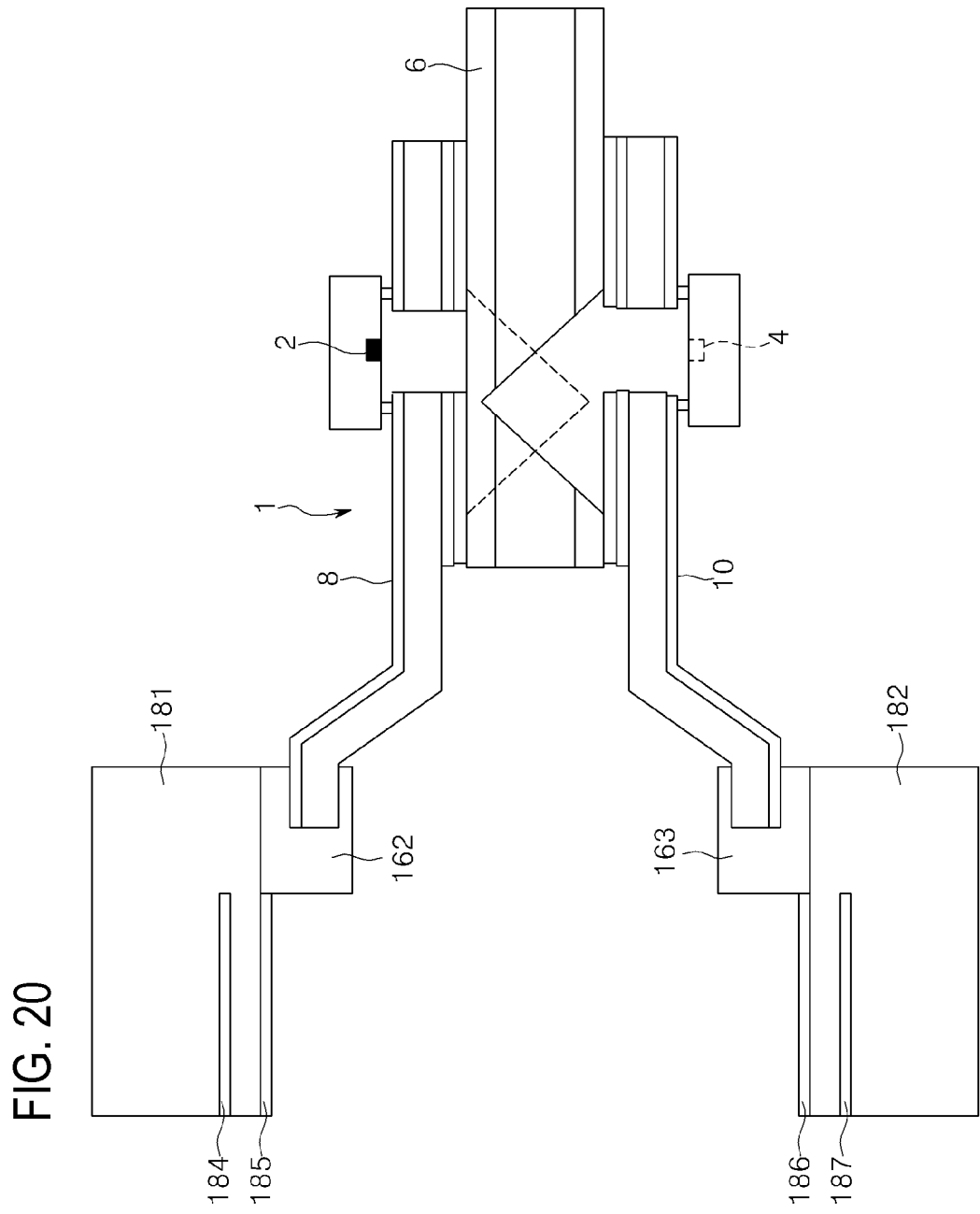
FIG. 20 is a cross-sectional view illustrating a cross-section made through the optical module in the mounting example illustrated in FIG. 19.

FIG. 19 is a second mounting example of an optical module according to an exemplary embodiment. FIG. 20 is a cross-sectional view illustrating a cross-section made through the optical module in the mounting example illustrated in FIG. 19. As illustrated in FIGS. 19 and 20, the first electric circuit board 8 including the first optical element 2 of the optical module 1 may be mounted to the electric connector 162 installed on the first sub-board 181. The second electric circuit board 10 including the second optical element 4 of the optical module 1 may be mounted to the electric connector 163 installed on the second sub-board 182.

The first sub-board 181 may be mounted in the standing state to the electric connector 165 installed on the server board 164. The second sub-board 182 may be mounted to another electric connector 183 installed on the server board 164. The first sub-board 181 may be a multi-layer wiring board including a plurality of wiring layers 184, 185. The second sub-board 182 may be a multi-layer wiring board including a plurality of wiring layers 186, 187.

On the first sub-board 181, circuit components 188 such as, for example, a microcomputer configured to control the circuit of the optical module 1, a flash memory, a condenser or a DC converter may be disposed on the second sub-board 182, circuit components such as, for example, a microcomputer configured to control the circuit of the optical module 1, a flash memory, a condenser or a DC converter may be mounted. The other components may be the same as the mounting example illustrated in FIG. 17.

Third Mounting Example of Optical Module

Figure 21:
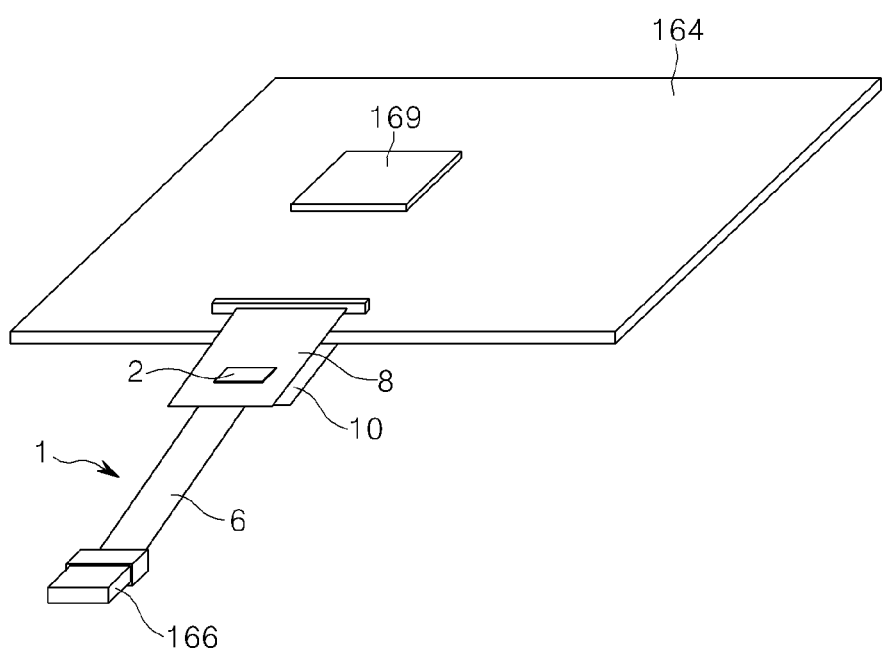
FIG. 21 is a third mounting example of an optical module according to an exemplary embodiment.

FIG. 21 is a view illustrating a third mounting example of an optical module according to an exemplary embodiment. As illustrated in FIG. 21, the first electric circuit board 8 including the first optical element 2 of the optical module 1 may be mounted to the electric connector 162 installed on one side surface of the server board 164. The second electric circuit board 10 including the second optical element 4 of the optical module 1 may be mounted to an electric connector (not illustrated in the drawing) installed on the other side surface of the server board 164. The optical connector 166 at the leading end of the optical waveguides 6 may be connected to another board within, for example, the server.

Also, in each of the mounting examples illustrated in FIGS. 17 to 21, the optical module is not limited to the optical module illustrated in FIG. 1 or FIGS. 2 to 5 and may be the optical module 121 illustrated in FIGS. 12 to 15 or the optical module 151 illustrated in FIG. 16.

First Example of Communication System

Figure 22:
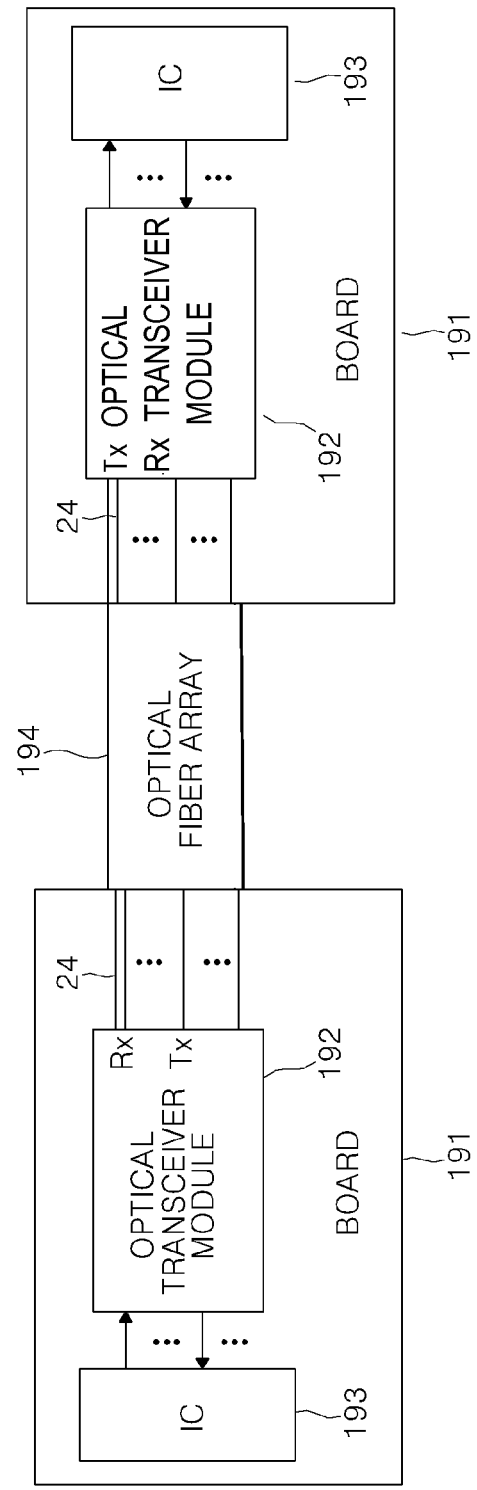
FIG. 22 is view illustrating a first example of a communication system to which an optical module according to an exemplary embodiment is applied.

FIG. 22 is a view illustrating a first example of a communication system to which an optical module according to an exemplary embodiment is applied. As illustrated in FIG. 22, an optical transceiver module 192 configured to transmit/receive an optical signal may be disposed on a board 191 such as, for example, a server board.

The optical transceiver module 192 may be, for example, the optical module 1 illustrated in FIG. 1 or FIGS. 2 to 5, the optical module 121 illustrated in FIGS. 12 to 15, or the optical module 151 illustrated in FIG. 16. When the optical transceiver module 192 is, for example, the optical module 1 illustrated in FIG. 1 or FIGS. 2 to 5 or the optical module 151 illustrated in FIG. 16, the first optical element 2 may be a light emitting device such as, for example, a VCSEL and the second optical element 4 may be a light receiving device such as, for example, a PD.

When the optical transceiver module 192 is, for example, the optical module 121 illustrated in FIGS. 12 to 15, the third optical element 122 and fourth optical element 124 may be a light emitting device such as, for example, a VCSEL and the first optical element 2 and the second optical element 4 may be a light receiving device such as, for example, a PD. The board 191 may be mounted with an integrated circuit 193 configured to control a signal processing of a transmission signal and a reception signal or the circuit of the optical transceiver module 192.

In the communication system, the board 191 including the optical transceiver module 192 may be mounted in each of a communication apparatus of one side and a counterpart communication apparatus of the other side of the communication system. In addition, an optical waveguide array 24 of the optical transceiver module 192 of the communication apparatus of one side and an optical waveguide array 24 of the optical transceiver module 192 of the counterpart communication apparatus may be connected through an optical fiber array 194.

Figure 23:
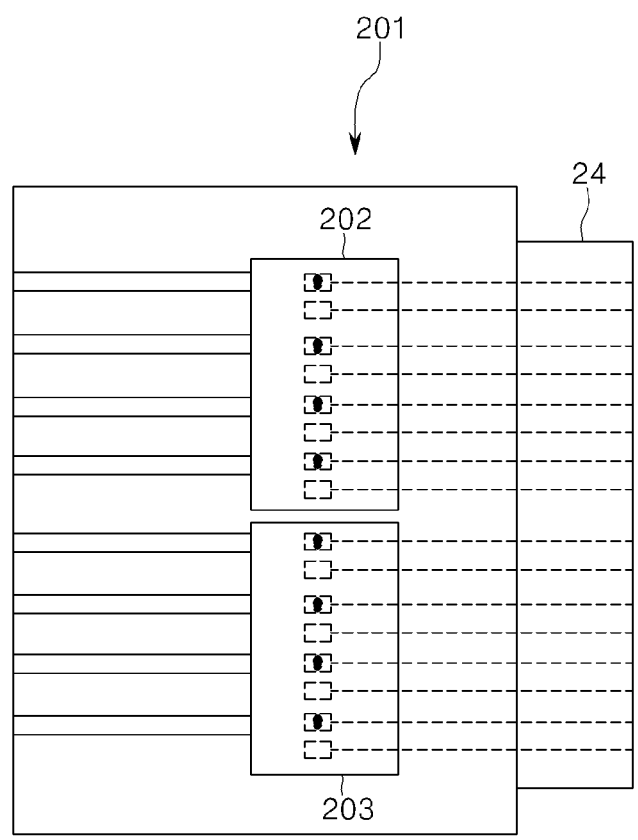
FIG. 23 is a top plan view illustrating an example of an optical module applied to the communication system illustrated in FIG. 22.
Figure 24:
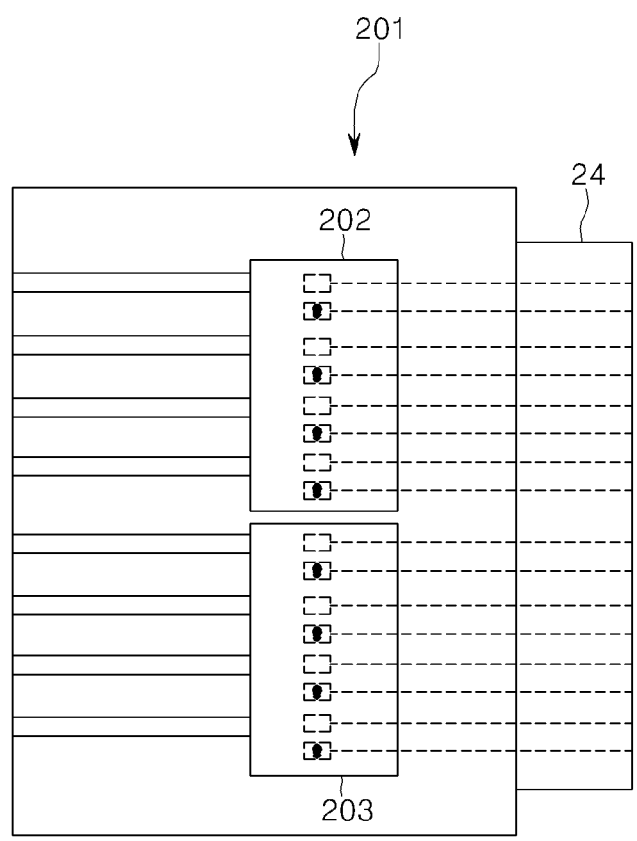
FIG. 24 is a bottom plan view illustrating the optical module applied to the communication system illustrated in FIG. 22.

FIG. 23 is a top plan view illustrating an example of an optical module applied to the communication system illustrated in FIG. 22. FIG. 24 is a bottom plan view illustrating the example of the optical module applied to the communication system illustrated in FIG. 22. In the communication system illustrated in FIG. 22, the optical transceiver modules 192 may be the optical module 201 illustrated in FIGS. 23 and 24.

The optical module 201 includes an optical transmitter module 202 configured to transmit an optical signal and an optical receiver module 203 configured to receive an optical signal separately. However, an optical waveguide array 24 is provided to be common to the optical transmitter module 202 and the optical receiver module 203.

The optical transmitter module 202 may be, for example, the optical module 1 illustrated in FIG. 1 or FIGS. 2 to 5, the optical module 121 illustrated in the FIGS. 12 to 15, or the optical module 151 illustrated in FIG. 16. When the optical transmitter module 202 is, for example, the optical module 1 illustrated in FIG. 1 or FIGS. 2 to 5 or the optical module 151 illustrated in FIG. 16, the first optical element 2 and the second optical element 4 may be a light emitting device such as, for example, a VCSEL. When the optical transmitter module 202 is, for example, the optical module 121 illustrated in FIGS. 12 to 15, the first optical element 2, the second optical element 4, the third optical element 122, and the fourth optical element 124 may be a light emitting device such as, for example, a VCSEL.

The optical receiver module 203 may be, for example, the optical module 1 illustrated in FIG. 1 or FIGS. 2 to 5, the optical module 121 illustrated in FIGS. 12 to 15, or the optical module 151 illustrated in FIG. 16. When the optical receiver module 203 is, for example, the optical module 1 illustrated in FIG. 1 or FIGS. 2 to 5 or the optical module 151 illustrated in FIG. 16, the first optical element 2 and the second optical element 4 may be a light receiving device such as, for example, a PD. When the optical receiver module 203 is, for example, the optical module 121 illustrated in FIGS. 12 to 15, the first optical element 2, the second optical element 4, the third optical element 122, and the fourth optical element 124 may be a light receiving device such as, for example, a PD.

Second Example of Communciation System

Figure 25:
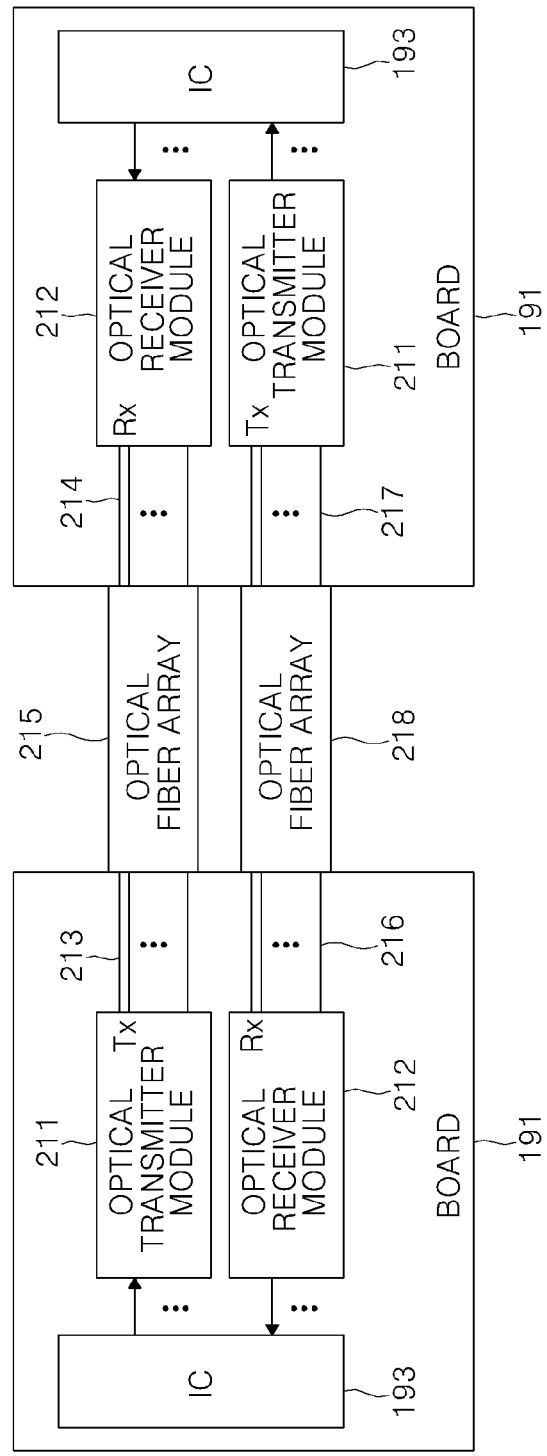
FIG. 25 is view illustrating a second example of a communication system to which an optical module according to an exemplary embodiment is applied.

FIG. 25 is a view illustrating a second example of the communication system to which an optical module according to an exemplary embodiment is applied. As illustrated in FIG. 25, an optical transmitter module 211 configured to transmit an optical signal and an optical receiver module 212 configured to receive an optical signal may be disposed on a board 191 such as, for example, a server board.

The optical transmitter module 211 may be, for example, the optical module 1 illustrated in FIG. 1 or FIGS. 2 to 5, the optical module 121 illustrated in FIGS. 12 to 15, or the optical module 151 illustrated in FIG. 16. When the optical transmitter module 211 is, for example, optical module 1 illustrated in FIG. 1 or FIGS. 2 to 5 or the optical module 151 illustrated in FIG. 16, the first optical element 2 and the second optical element 4 may be a light emitting device such as, for example, a VCSEL. When the optical transmitter module 211 is, for example, the optical module 121 illustrated in FIGS. 12 to 15, the first optical element 2, the second optical element 4, the third optical element 122, and the fourth optical element 124 may be a light emitting device such as, for example, a VCSEL.

The optical receiver module 212 may be, for example, the optical module 1 illustrated in FIG. 1 or FIGS. 2 to 5, the optical module 121 illustrated in FIGS. 12 to 15, or the optical module 151 illustrated in FIG. 16. When the optical receiver module 212 is, for example, the optical module 1 illustrated in FIG. 1 or FIGS. 2 to 5, or the optical module 151 illustrated in FIG. 16, the first optical element 2 and the second optical element 4 may be a light receiving device such as a PD. When the optical receiver module 212 is, for example, the optical module 121 illustrated in FIGS. 12 to 15, the first optical element 2, the second optical element 4, the third optical element 122, and the fourth optical element 124 may be a light receiving device such as, for example, a PD.

In the communication system, the board 191 including the optical transmitter module 211 and the optical receiver module 212 may be mounted in each of a communication apparatus of one side and a counterpart communication apparatus of the other side of the communication system. In addition, the optical waveguide array 213 of the optical transmitter module 211 of the communication apparatus of one side and the optical waveguide array 214 of the optical receiver module 212 of the counterpart communication apparatus may be connected through an optical fiber array 215. The optical waveguide array 216 of the optical receiver module 212 of the communication apparatus of one side and the optical waveguide array 217 of the optical transmitter module 211 of the counterpart communication apparatus may be connected through an optical fiber array 218.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present disclosure have been described in detail, it should be understood that the various changes, substitutions, and alterations could be made hereto without departing from the spirit and scope of the invention.

What is claimed is:
1. An optical module, comprising:
a plurality of first optical elements each configured to conduct a conversion between an electric signal and an optical signal;
a plurality of first electric signal wirings each configured to transmit an electric signal input to one of the plurality of first optical elements or an electric signal output from one of the plurality of first optical elements;
a plurality of second optical elements each configured to conduct a conversion between an electric signal and an optical signal;
a plurality of second electric signal wirings each configured to transmit an electric signal input to one of the plurality of second optical elements or an electric signal output from one of the plurality of second optical elements; and
a plurality of optical waveguides each configured to guide an optical signal emitted from one of the plurality of first optical elements or the plurality of second optical elements, or an optical signal incident on one of the plurality of first optical elements or one of the plurality of second optical elements,
wherein the plurality of first optical elements are disposed on a first surface side of the plurality of optical waveguides,
the plurality of first electric signal wirings are disposed on the first surface side of the plurality of optical waveguides side by side in parallel with each other in a direction intersecting with a transmission direction of the electric signal transmitted by a first electric signal wiring,
the plurality of second optical elements are disposed on a second surface side of the plurality of optical waveguides,
the plurality of second electric signal wirings are disposed on the second surface side of the plurality of optical waveguides side by side in parallel with each other in a direction intersecting with a transmission direction of the electric signal transmitted by a second electric signal wirings, and
the plurality of optical waveguides are disposed side by side in parallel with each other in a direction intersecting with a waveguide direction of the optical signal guided by an optical waveguide at an interval which is narrower than an interval between adjacent first electric signal wirings and narrower than an interval between adjacent second electric signal wirings.

2. The optical module according to claim 1, further comprising:
a first mirror configured to optically couple a first optical element and an optical waveguide, and
a second mirror configured to optically couple a second optical element and an optical waveguide,
wherein the first mirror is formed in a V-shaped recess at an end of the optical waveguide on the second surface side of the plurality of optical waveguides, and the second mirror is formed in a V-shaped recess at an end of the optical waveguide on the first surface side of the plurality of optical waveguides.

3. The optical module according to claim 2, wherein the first optical element and the first electric signal wiring are distributed over a plurality of layers.

4. The optical module according to claim 3, wherein, among the plurality of layers provided with the first optical element and the first electric signal wiring, the first optical element provided in a layer of the optical waveguide side is a light receiving device.

5. The optical module according to claim 3, wherein the second optical element and the second electric signal wiring are distributed over a plurality of layers.

6. The optical module according to claim 5, wherein, among the plurality of layers provided with the second optical element and the second electric signal wiring, the second optical element provided in a layer of the optical waveguide side is a light receiving device.

7. The optical module according to claim 1, wherein the optical signal emitted from a first optical element or the optical signal incident on the first optical element has a polarizing direction orthogonal to a polarizing direction of the optical signal emitted from a second optical element or the optical signal incident on the second optical element, a mirror is formed in a V-shaped recess at an end of an optical waveguide on the second surface side of the plurality of optical waveguides, and the mirror is provided with a reflective film on one inclined surface of the recess and provided with a polarizing beam splitter on the other inclined surface of the recess, the reflective film being configured to reflect the optical signal emitted from the second optical element or the optical signal incident on the second optical element, and the polarizing beam splitter being configured to transmit the optical signal emitted from the second optical element or the optical signal incident on the second optical element and to reflect the optical signal emitted from the first optical element or the optical signal incident on the first optical element.

8. The optical module according to claim 1, wherein the plurality of optical waveguides are formed in an optical waveguide array which is a polymer waveguide array.

9. The optical module according to claim 1, wherein each of the first electric signal wirings and the second electric signal wirings is formed on a flexible electric circuit board.

10. An optical module, comprising:
first optical elements disposed on a first surface side of optical waveguides;
first signal wirings disposed on the first surface side in parallel with each other in a direction intersecting with a transmission direction of an electrical signal transmitted by a first signal wiring;
second optical elements disposed on a second surface side of the optical waveguides; and
second signal wirings disposed on the second surface side in parallel with each other in a direction intersecting with a transmission direction of an electrical signal transmitted by a second signal wirings, the optical waveguides being disposed in parallel with each other in a direction intersecting with an optical waveguide direction of an optical signal guided by an optical waveguide at an interval which is narrower than an interval between the adjacent first signal wirings and narrower than an interval between the adjacent second signal wirings.

* * * * *